(12) United States Patent
Lee et al.

(10) Patent No.: US 9,466,554 B2
(45) Date of Patent: Oct. 11, 2016

(54) INTEGRATED DEVICE COMPRISING VIA WITH SIDE BARRIER LAYER TRAVERSING ENCAPSULATION LAYER

(71) Applicant: QUALCOMM Incorporated, San Diego, CA (US)

(72) Inventors: Jae Sik Lee, San Diego, CA (US); Hong Bok We, San Diego, CA (US); Dong Wook Kim, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 246 days.

(21) Appl. No.: 14/274,517

(22) Filed: May 9, 2014

(65) Prior Publication Data

US 2015/0228556 A1   Aug. 13, 2015

Related U.S. Application Data

(60) Provisional application No. 61/939,523, filed on Feb. 13, 2014.

(51) Int. Cl.
| | |
|---|---|
| *H01L 21/4763* | (2006.01) |
| *H01L 23/48* | (2006.01) |
| *H01L 23/50* | (2006.01) |
| *H01L 21/56* | (2006.01) |
| *H01L 21/768* | (2006.01) |
| *H01L 23/498* | (2006.01) |

(Continued)

(52) U.S. Cl.
CPC ............. *H01L 23/481* (2013.01); *H01L 21/56* (2013.01); *H01L 21/76802* (2013.01); *H01L 21/76877* (2013.01); *H01L 23/49827* (2013.01); *H01L 23/50* (2013.01); *H01L 25/105* (2013.01); *H01L 25/0655* (2013.01); *H01L 2224/16225* (2013.01); *H01L 2225/1023* (2013.01); *H01L 2225/1058* (2013.01); *H01L 2924/1533* (2013.01); *H01L 2924/15311* (2013.01)

(58) Field of Classification Search
CPC ............. H01L 21/56; H01L 21/76802; H01L 21/76877
See application file for complete search history.

(56) References Cited

U.S. PATENT DOCUMENTS

| | | |
|---|---|---|
| 6,586,682 B2 | 7/2003 | Strandberg |
| 7,799,602 B2 | 9/2010 | Pagaila et al. |

(Continued)

OTHER PUBLICATIONS

International Search Report and Written Opinion—PCT/US2015/015421—ISA/EPO—May 8, 2015.

*Primary Examiner* — Bradley K Smith
(74) *Attorney, Agent, or Firm* — Loza & Loza, LLP

(57) ABSTRACT

Some novel features pertain to an integrated device that includes an encapsulation layer, a via structure traversing the encapsulation layer, and a pad. The via structure includes a via that includes a first side, a second side, and a third side. The via structure also includes a barrier layer surrounding at least the first side and the third side of the via. The pad is directly coupled to the barrier layer of the via structure. In some implementations, the integrated device includes a first dielectric layer coupled to a first surface of the encapsulation layer. In some implementations, the integrated device includes a substrate coupled to a first surface of the encapsulation layer. In some implementations, the integrated device includes a first die coupled to the substrate, where the encapsulation layer encapsulates the first die. In some implementations, the via includes a portion configured to operate as a pad.

28 Claims, 19 Drawing Sheets

(51) Int. Cl.
*H01L 25/10* (2006.01)
*H01L 25/065* (2006.01)

(56) References Cited

U.S. PATENT DOCUMENTS

| | | |
|---|---|---|
| 8,373,069 B2 | 2/2013 | Kariya et al. |
| 2007/0004096 A1* | 1/2007 | Heuvelman ......... B81C 1/00301 438/127 |
| 2008/0265419 A1* | 10/2008 | Frohberg .......... H01L 21/76843 257/753 |
| 2009/0326851 A1* | 12/2009 | Tanenhaus ............. G01C 21/16 702/96 |
| 2012/0007256 A1 | 1/2012 | Pratt |
| 2012/0168944 A1 | 7/2012 | Gan et al. |
| 2013/0292684 A1 | 11/2013 | Nikitin et al. |
| 2013/0341786 A1 | 12/2013 | Hsu et al. |

\* cited by examiner

INTEGRATED DEVICE COMPRISING VIA WITH SIDE BARRIER LAYER TRAVERSING ENCAPSULATION LAYER

The present application claims priority to U.S. Provisional Application No. 61/939,523, entitled "Integrated Device Comprising Via With Side Barrier Layer Traversing Encapsulation Layer", filed Feb. 13, 2014, which is hereby expressly incorporated by reference herein.

BACKGROUND

1. Field

Various features relate to an integrated device that includes a via with a side barrier layer that traverses an encapsulation layer.

2. Background

FIG. 1 illustrates a first package 102 being coupled to a second package 104. The first package 102 includes a first substrate 106, a first die (e.g., chip) 108, a mold 110, a first set of solder balls 116, and a first set of interconnects 118, and a third set of solder balls 126. The first substrate 106 may include traces and/or vias (both of which are not shown). The second package 104 includes a second substrate 105, a second die 107, a third die 109, a second set of solder balls 115, a first set of wire bonding 117, and a second set of wire bonding 119. The second substrate 105 may include traces and/or vias (both of which are not shown). The second package 104 is positioned above the first package 102.

The first die 108 is coupled to a first surface (e.g., top surface) of the first substrate 106 through the first set of interconnects 118. The mold 110 encapsulates the first die 108 and the first set of interconnects 118. The first set of solder balls 116 is coupled to a second surface (e.g., bottom surface) of the first substrate 106. The third set of solder balls 126 is coupled to the first surface (e.g., top surface) of the first substrate 106. The third set of solder balls 126 is surrounded by the mold 110. The first substrate 106 includes a set of traces and/or vias that may electrically connect to the first die 108 and/or the first set of solder balls 116.

The second die 107 and the third die 109 are coupled to a first surface (e.g., top surface) of the second substrate 105. The second die 107 is electrically coupled to the traces and/or vias of the second substrate 105 through the first set of wire bonding 117. The third die 109 is electrically coupled to the traces and/or vias of the second substrate 105 through the second set of wire bonding 119. The second set of solder balls 115 is coupled to a second surface (e.g., bottom surface) of the second substrate 105.

FIG. 2 illustrates a conventional package on package (PoP) integrated device. As shown in FIG. 2, the integrated device 200 includes the first package 102 and the second package 104 of FIG. 1. As shown in FIG. 2, when the first package 102 is coupled to the second package 104, the second set of solder balls 115 of the second package 104 is coupled to the third set of solder balls 126 of the first package 102.

One major drawback of the package on package (PoP) configuration shown in FIGS. 1 and 2 is that it creates an integrated device with a form factor that may be too large for the needs of mobile computing devices. That is, the PoP configuration shown in FIG. 2 may be too thick and/or have a surface area that is too large to meet the needs and/or requirements of mobile computing devices. In particular, there is a constant need to reduce the size of integrated devices, especially integrated device that are going to be implemented in mobiles devices. Moreover, the process of fabricating the PoP configuration can be complicated and costly.

Therefore, there is a need for a cost effective integrated package that has an improved form factor (e.g., smaller, narrower, thinner). Ideally, such an integrated package will provide higher density connections, as well being more cost effective (e.g., cheaper) to fabricate than current integrated packages.

SUMMARY

Various features, apparatus and methods described herein provide an integrated device that includes a via with a side barrier layer that traverses an encapsulation layer.

A first example provides an integrated device that includes an encapsulation layer, a via structure traversing the encapsulation layer, and a pad. The via structure includes a via that includes a first side, a second side, and a third side. The via structure also includes a barrier layer surrounding at least the first side and the third side of the via. The pad is directly coupled to the barrier layer of the via structure.

According to an aspect, the integrated device includes a first dielectric layer coupled to a first surface of the encapsulation layer. In some implementations, the integrated device includes a second dielectric layer coupled to a second surface of the encapsulation layer.

According to one aspect, the integrated device includes a substrate coupled to a first surface of the encapsulation layer. In some implementations, the integrated device includes a first die coupled to the substrate, where the encapsulation layer encapsulates the first die. In some implementations, the via structure further comprises a fill.

According to an aspect, the via includes a seed layer.

According to one aspect, the via includes a portion configured to operate as a pad.

According to an aspect, the integrated device includes one of at least an interposer, a package device, and/or a package-on-package (PoP) device.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes an encapsulation layer, a via structure traversing the encapsulation layer, and a pad. The via structure includes a via that includes a first side, a second side, and a third side. The via structure includes a barrier means surrounding at least the first side and the third side of the via. The pad is directly coupled to the barrier layer of the via structure.

According to an aspect, the apparatus includes a first dielectric layer coupled to a first surface of the encapsulation layer. In some implementations, the apparatus includes a second dielectric layer coupled to a second surface of the encapsulation layer.

According to one aspect, the apparatus includes a substrate coupled to a first surface of the encapsulation layer. In some implementations, the apparatus a first die coupled to the substrate, where the encapsulation layer encapsulates the first die.

According to an aspect, the via structure includes a fill means.

According to one aspect, the via includes a seed layer.

According to an aspect, the via includes a portion configured to operate as a pad.

According to one aspect, the apparatus includes one of at least an interposer, a package device, and/or a package-on-package (PoP) device.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating an integrated device. The method forms a pad on a substrate. The method forms an encapsulation layer on the substrate. The method forms a via structure in the encapsulation layer, where forming the via structure includes (1) forming a barrier layer in the encapsulation layer, and (2) forming a via on the barrier layer, the via comprising a first side, a second side, and a third side, the via is formed on the barrier layer such that the barrier layer surrounds at least the first side and the third side of the via, where the barrier layer is directly coupled to the pad.

According to an aspect, the method forms a first dielectric layer on a first surface of the encapsulation layer.

According to one aspect, the method forms a second dielectric layer on a second surface of the encapsulation layer.

According to an aspect, the method removes at least a portion of the substrate.

According to one aspect, the method couples a first die to the substrate, where forming the encapsulation layer comprising encapsulating the first die with the encapsulation layer.

According to an aspect, forming the via structure includes forming a fill.

According to one aspect, forming the via includes forming a seed layer on the barrier layer.

According to an aspect, forming the via includes forming a portion a via as a pad.

According to one aspect, the integrated device comprises one of at least an interposer, a package device, and/or a package-on-package (PoP) device.

According to an aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

Figure 5A:
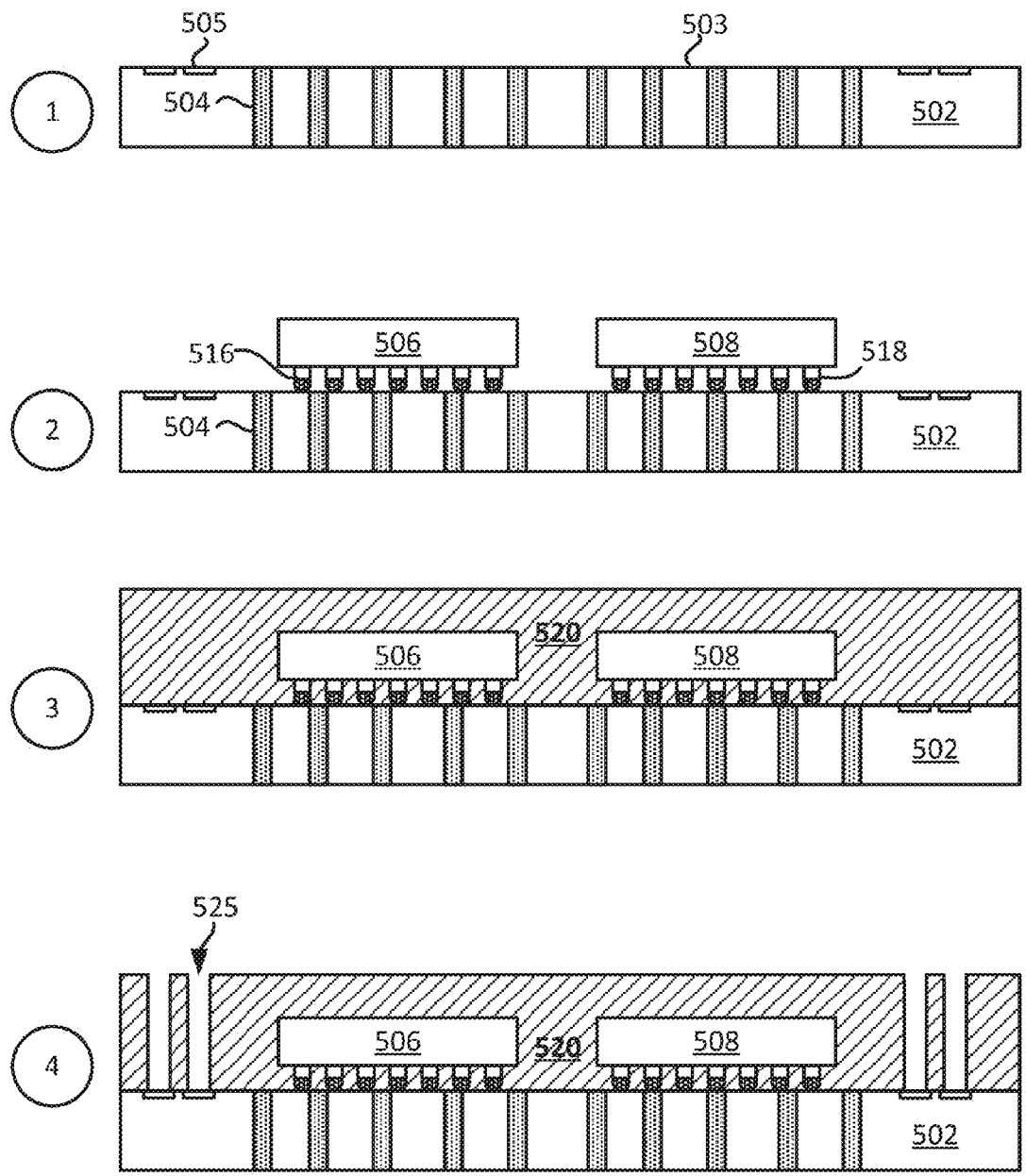
Figure 5B:
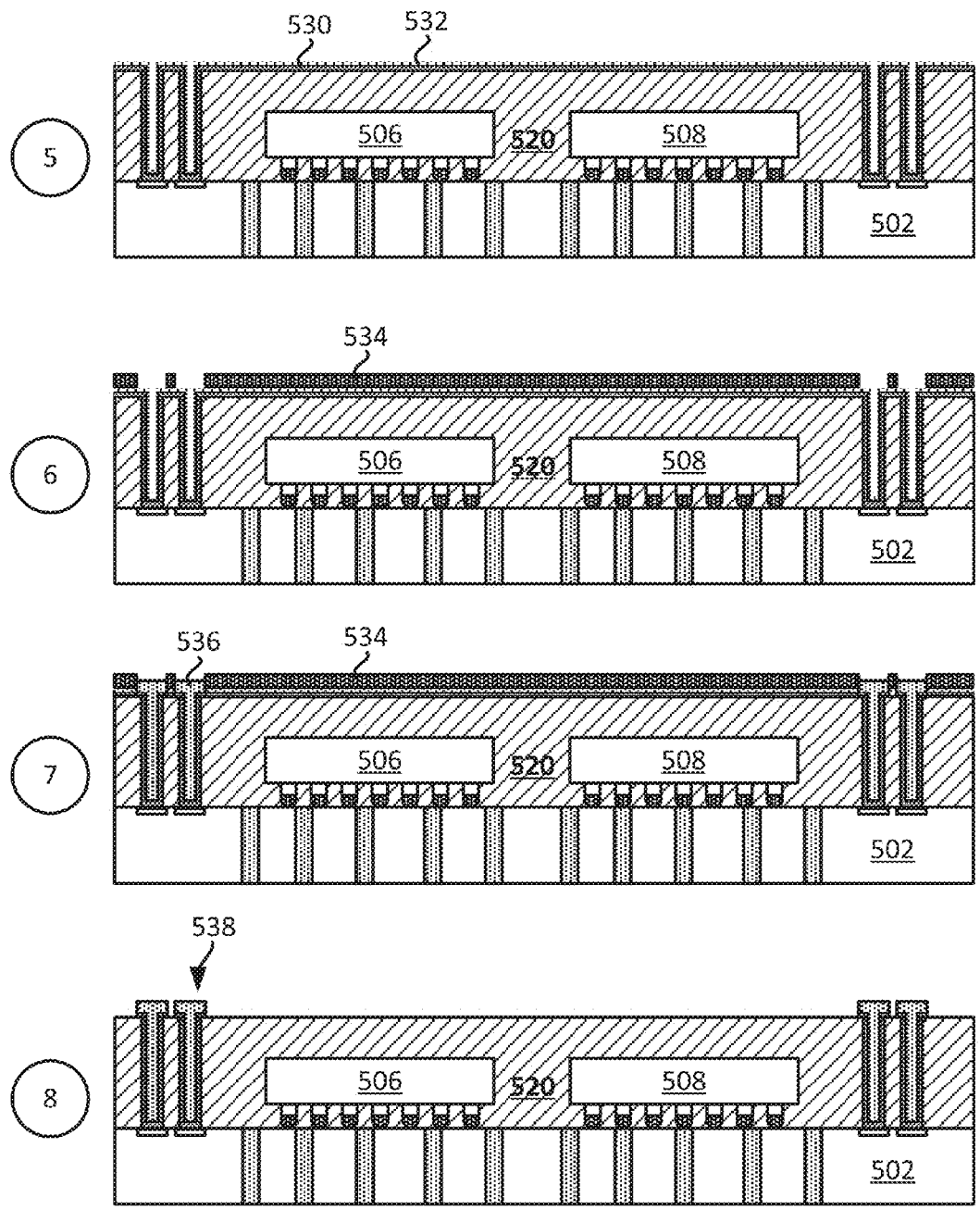
Figure 5C:
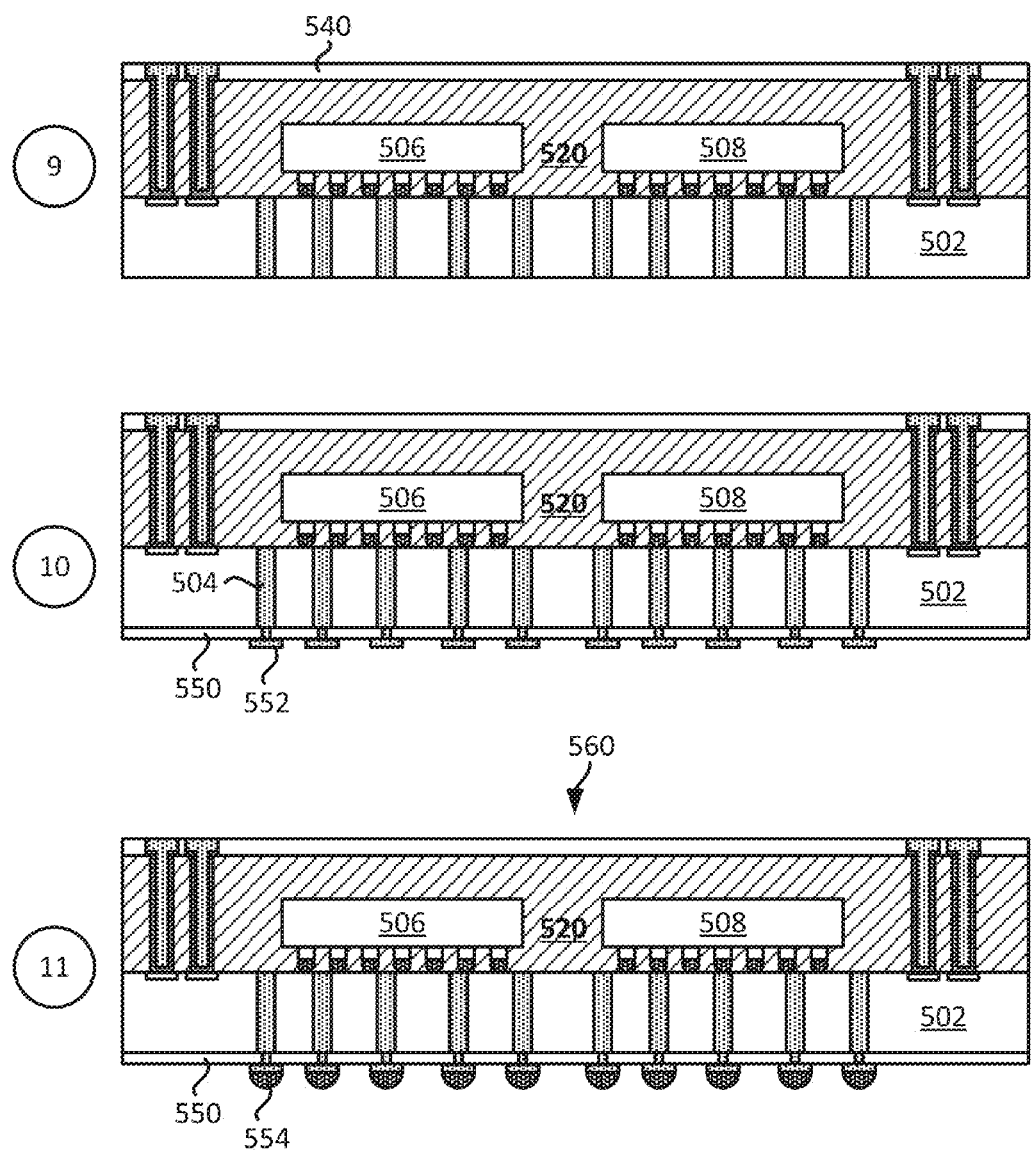

FIG. 5 (comprising FIGS. 5A, 5B, and 5C) illustrates an exemplary sequence for providing/manufacturing an integrated device that includes a through encapsulation via (TEV) with a side barrier layer.

Figure 6:
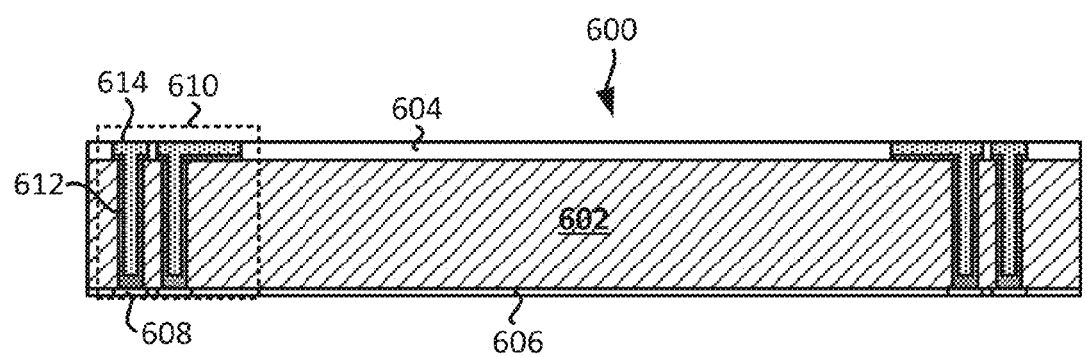

FIG. 6 illustrates an example of an interposer that includes a through encapsulation via (TEV) with a side barrier layer.

Figure 7A:
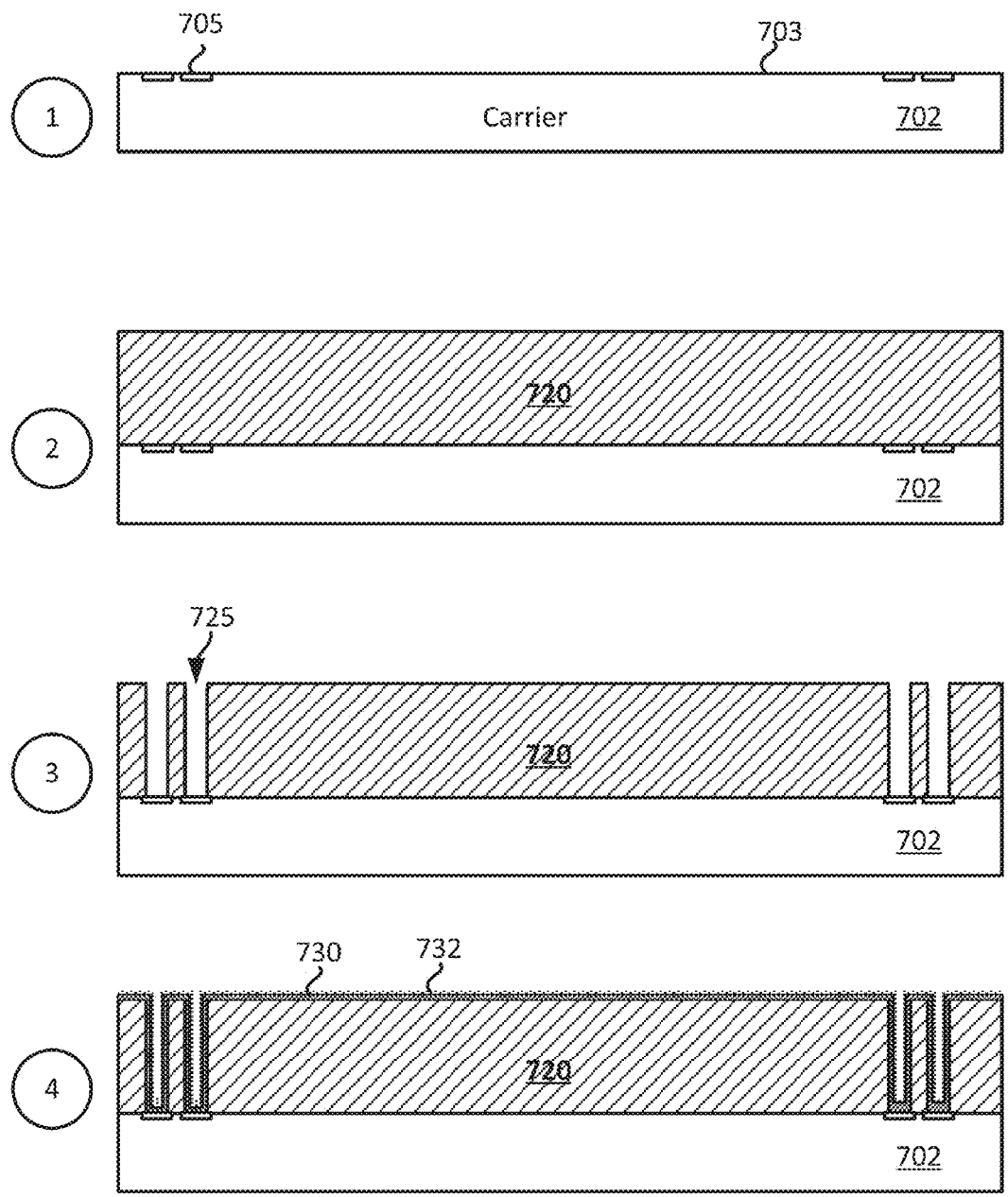
Figure 7B:
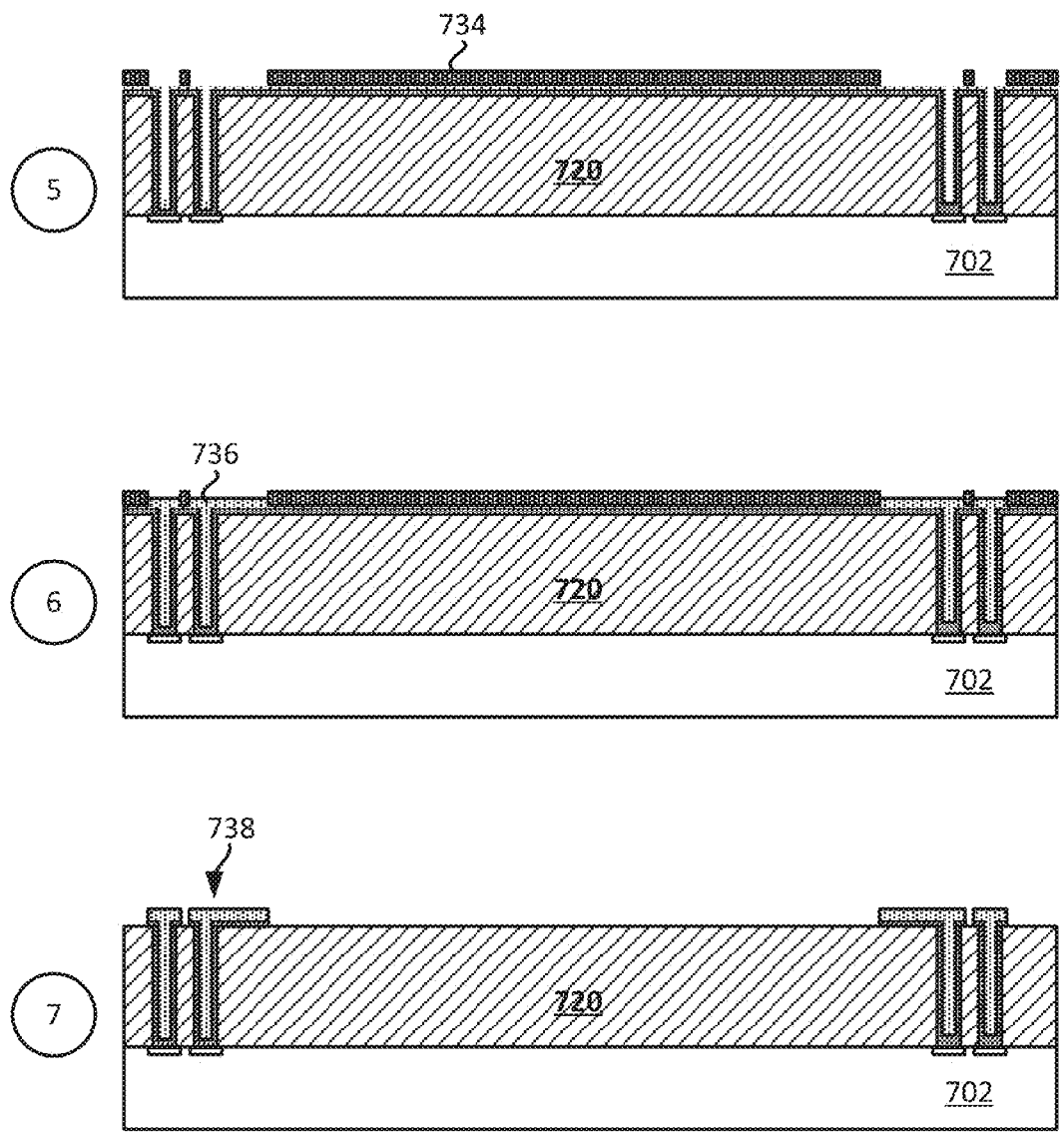
Figure 7C:
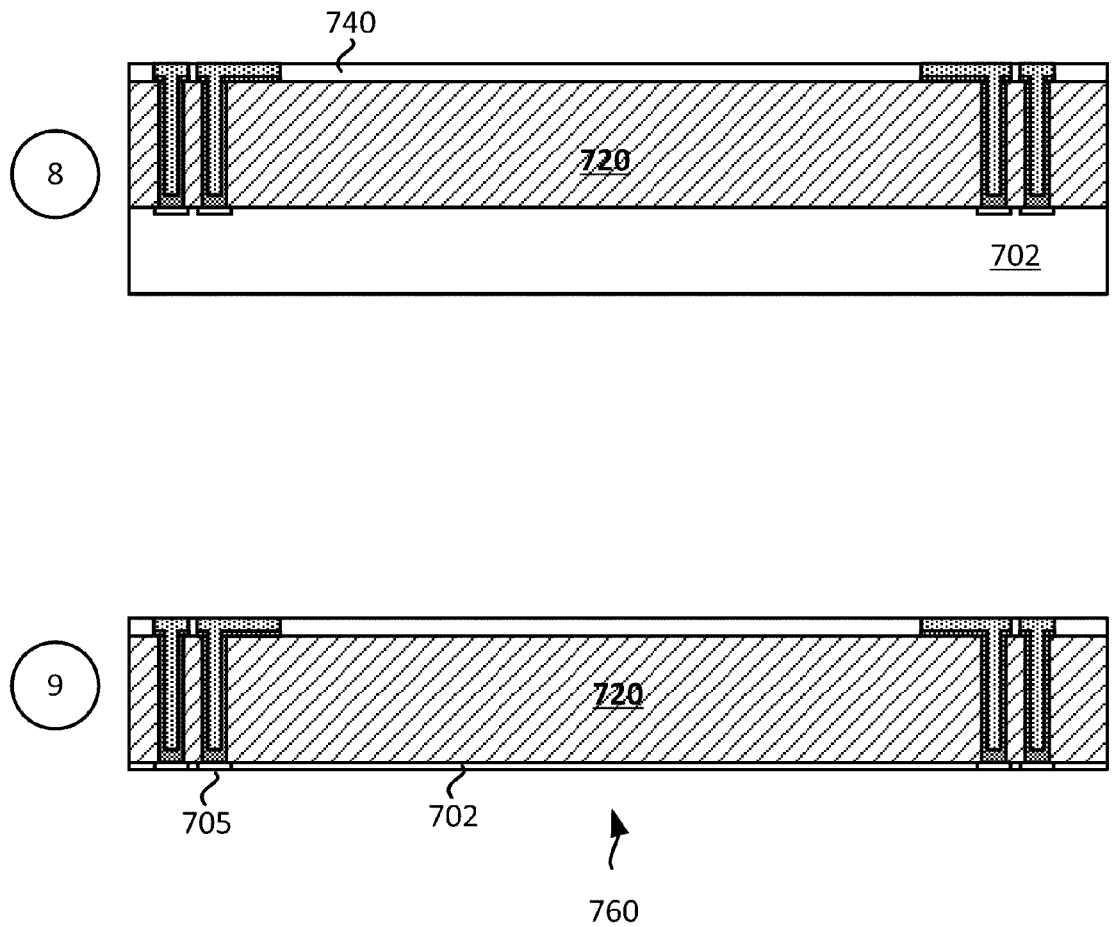

FIG. 7 (comprising FIGS. 7A, 7B, and 7C) illustrates an exemplary sequence for providing/manufacturing an integrated device that includes a through encapsulation via (TEV) with a side barrier layer.

Figure 8:
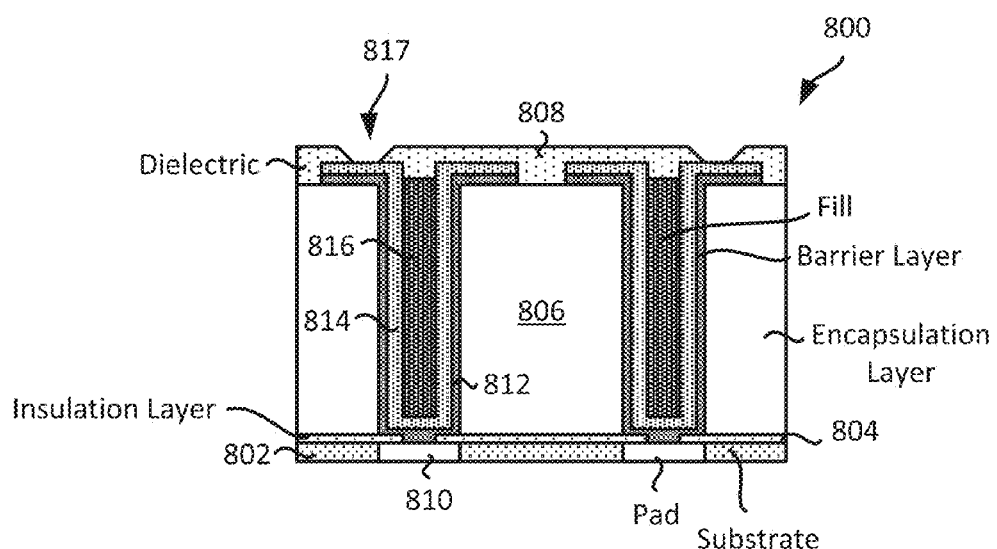

FIG. 8 illustrates an example of a through encapsulation via (TEV) that includes a side barrier layer and fill.

Figure 9:
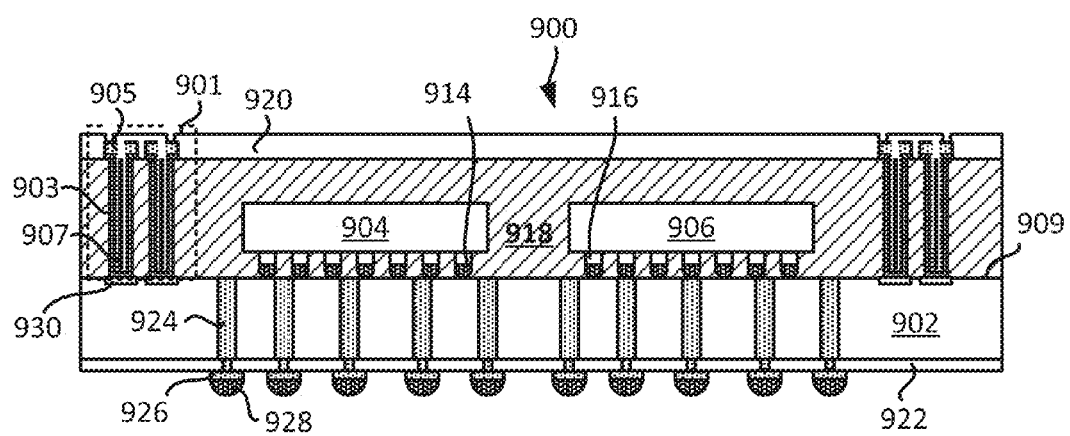

FIG. 9 illustrates an example of an integrated device that includes a through encapsulation via (TEV) with a side barrier layer.

Figure 10A:
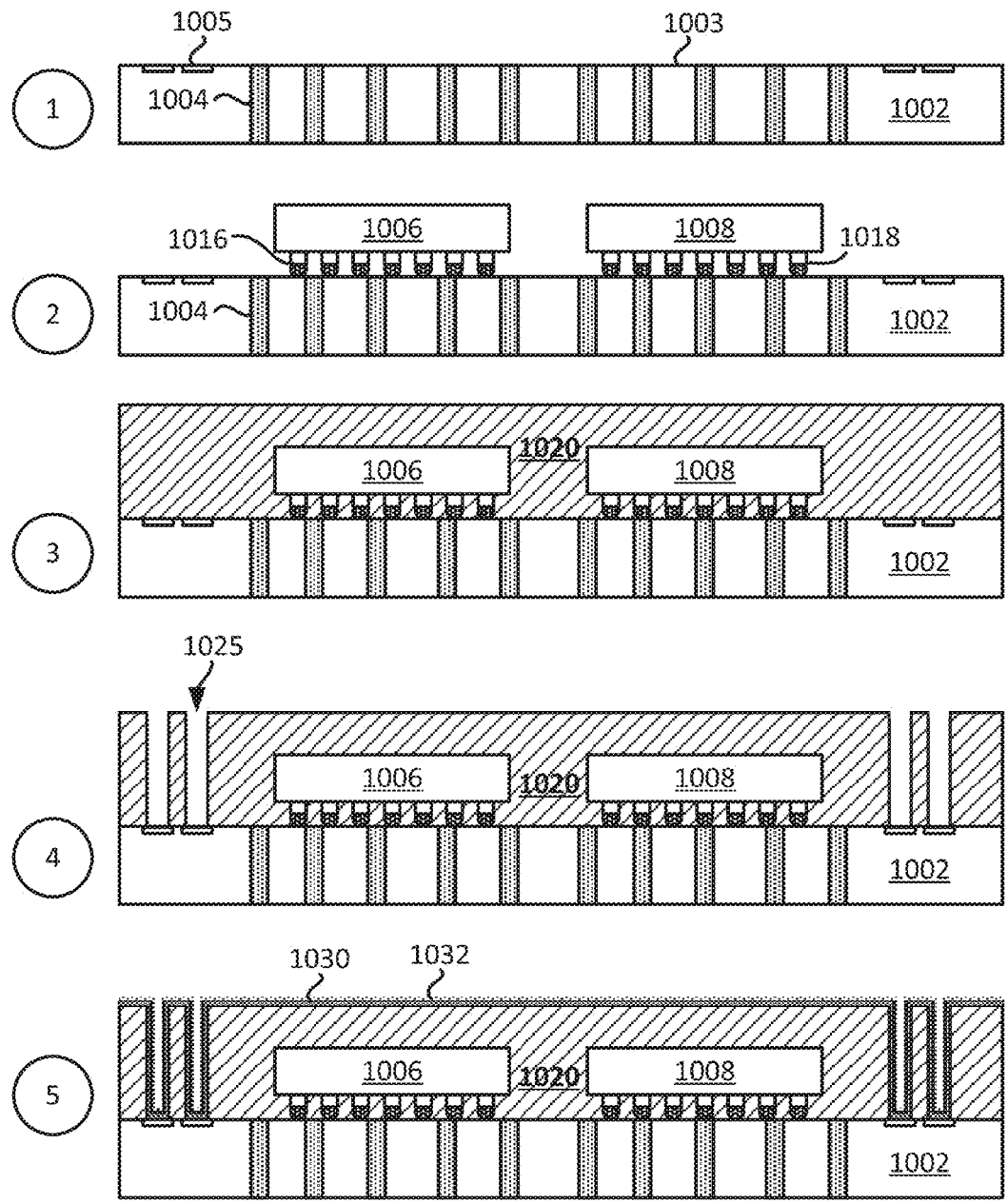
Figure 10B:
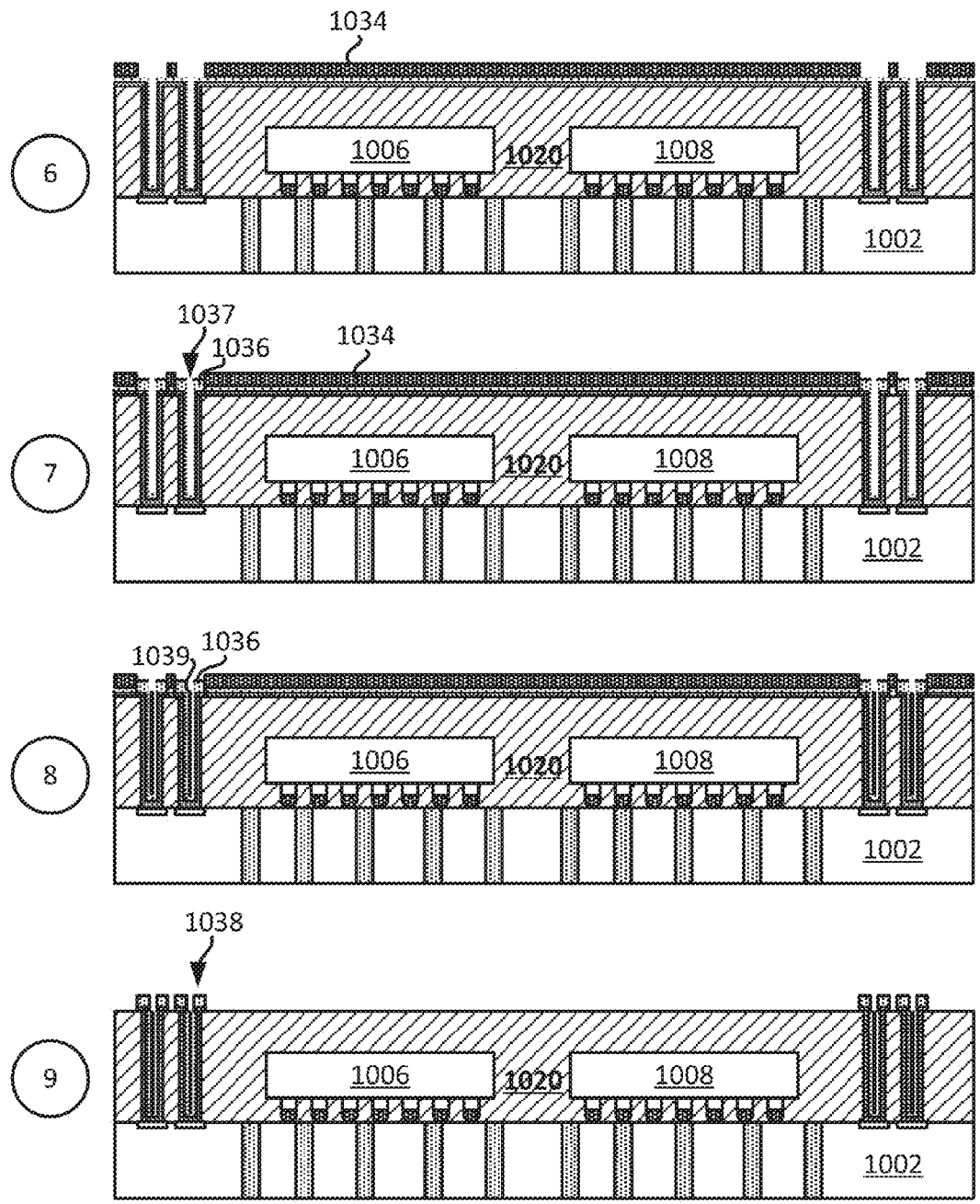
Figure 10C:
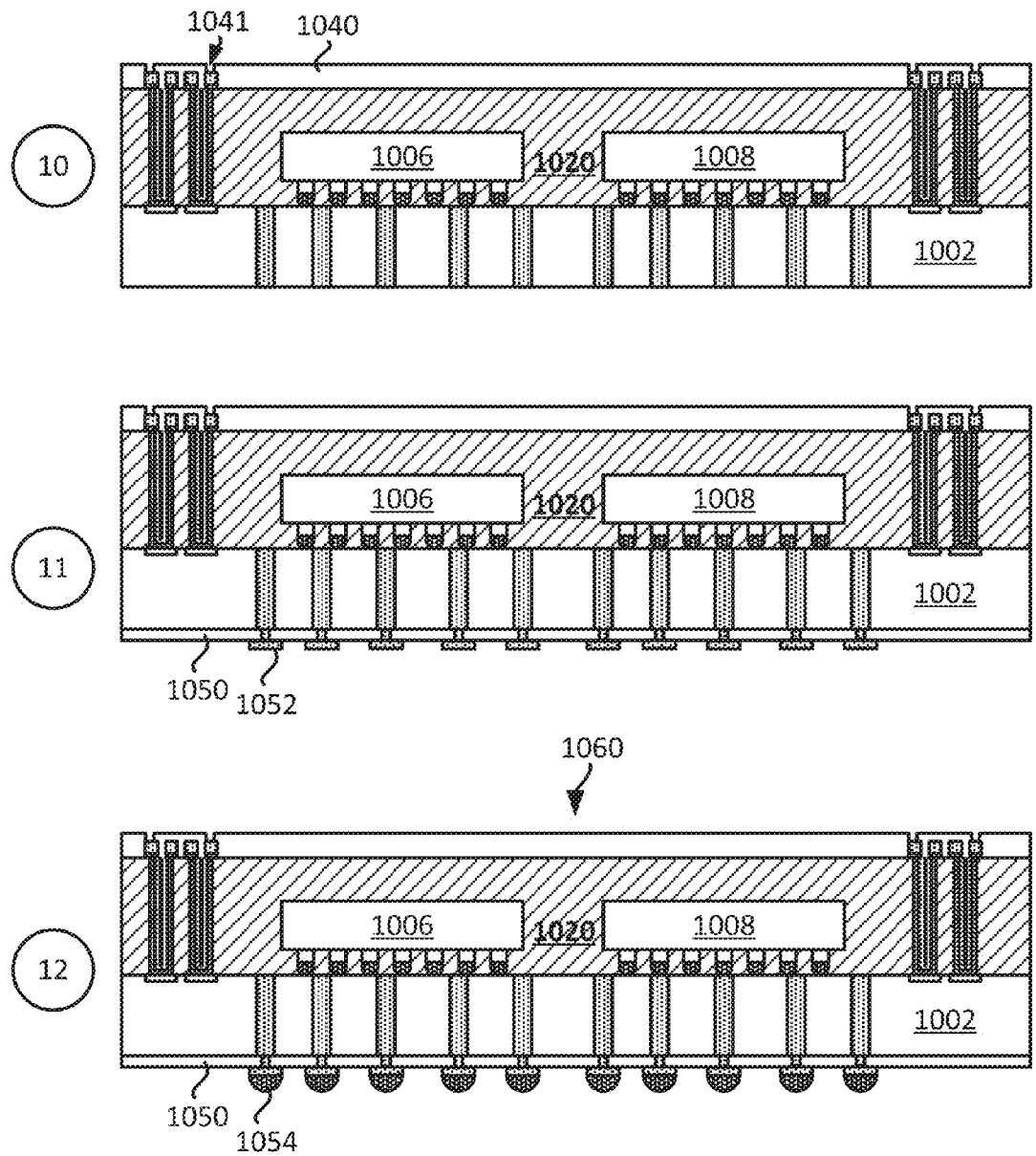

FIG. 10 (comprising FIGS. 10A, 10B, and 10C) illustrates an exemplary sequence for providing/manufacturing an integrated device that includes a through encapsulation via (TEV) with a side barrier layer.

Figure 11:
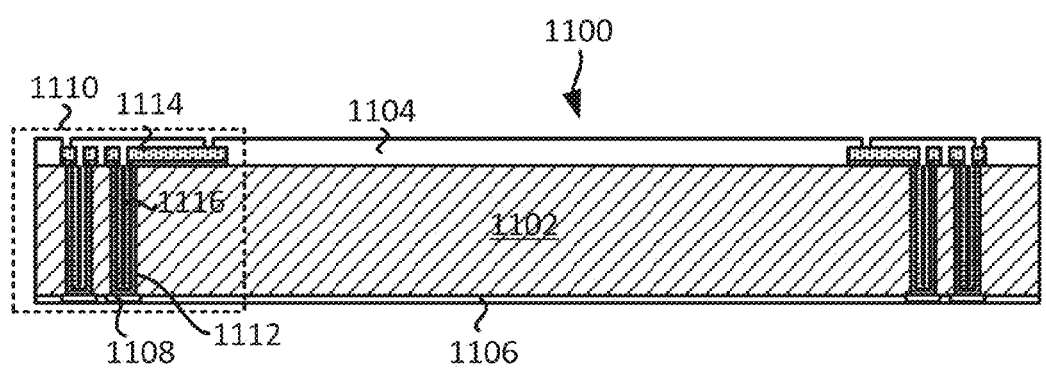

FIG. 11 illustrates an example of an interposer that includes a through encapsulation via (TEV) with a side barrier layer and a fill.

FIG. 12 (comprising FIGS. 12A, 12B, and 12C) illustrates an exemplary sequence for providing/manufacturing an integrated device that includes a through encapsulation via (TEV) with a side barrier layer.

Figure 13:
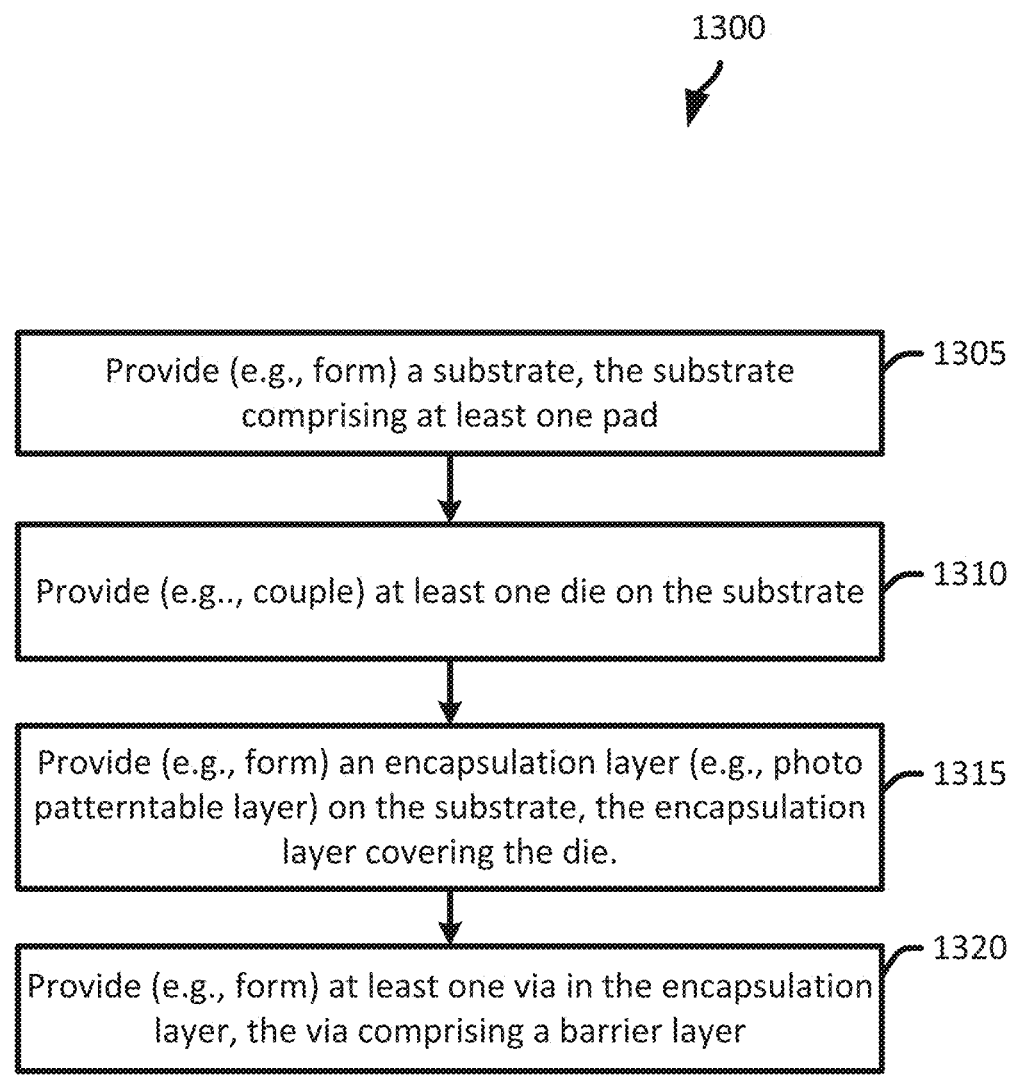

FIG. 13 illustrates an exemplary a flow diagram of a method for providing/manufacturing an integrated device that includes a through encapsulation via (TEV) with a side barrier layer.

Figure 14:
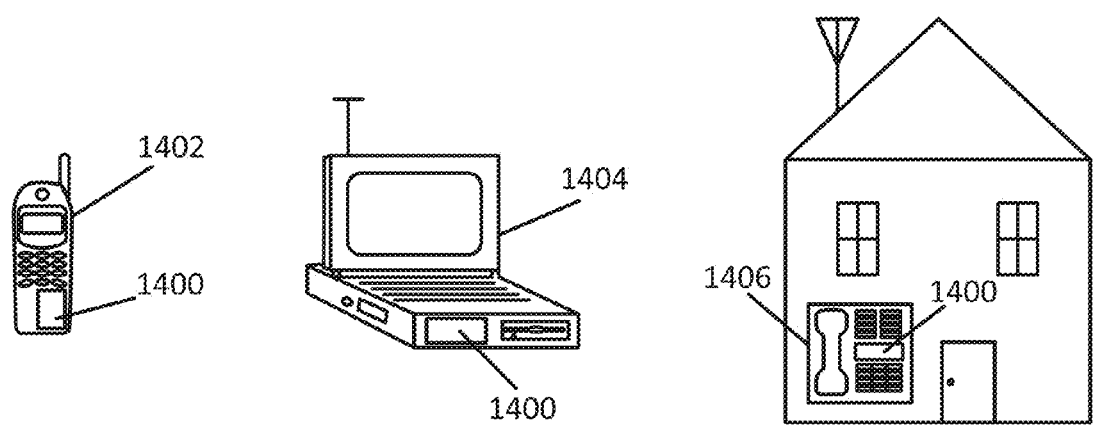

FIG. 14 illustrates various electronic devices that may integrate an integrated device, a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., integrated package, interposer) that includes an encapsulation layer, a via structure traversing the encapsulation layer, and a pad. The via structure includes a via that includes a first side, a second side, and a third side. The via structure also includes a barrier layer surrounding at least the first side and the third side of the via. The pad is directly coupled to the barrier layer of the via structure. In some implementations, the via structure also includes a fill (e.g., polymer fill). In some implementations, the integrated device includes a first dielectric layer coupled to a first surface of the encapsulation layer. In some implementations, the integrated device includes a second dielectric layer coupled to a second surface of the encapsulation layer. In some implementations, the integrated device includes a substrate coupled to a first surface of the encapsulation layer. In some implementations, the integrated device includes a first die coupled to the substrate, where the encapsulation layer encapsulates the first die. In some implementations, the substrate includes a set of through substrate vias (TSVs). In some implementations, the via includes a seed layer. In some implementations, the via includes a portion configured to operate as a pad.

Figure 1:
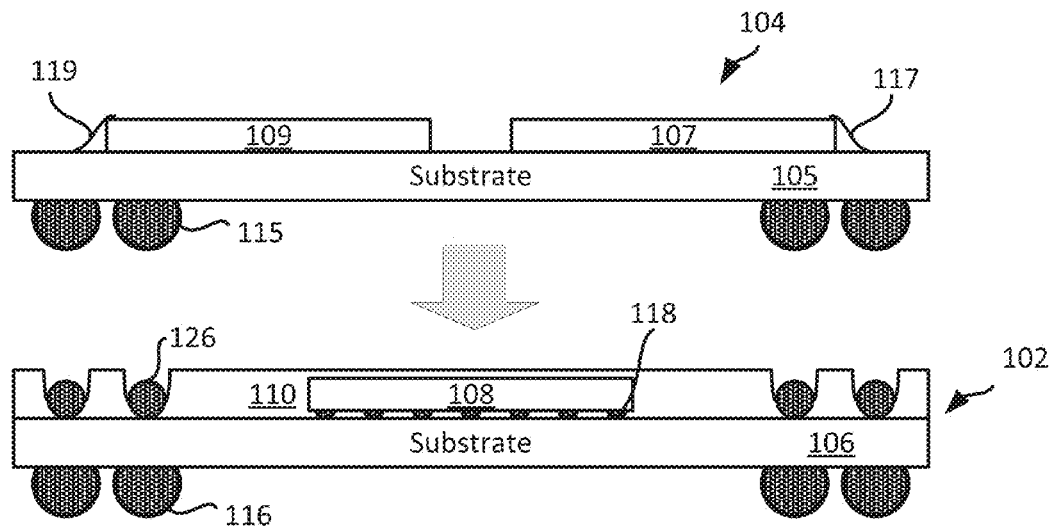
FIG. 1 illustrates a profile view of a first package being coupled to a second package.
Figure 2:
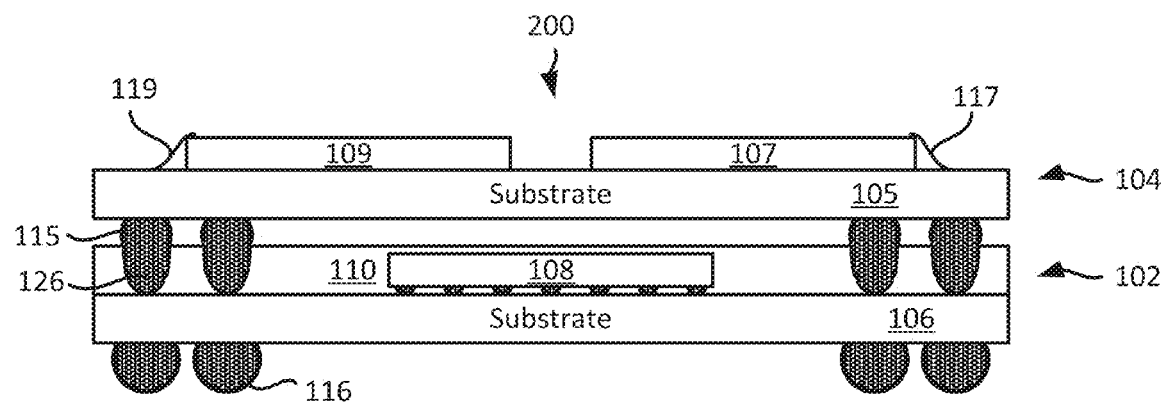
FIG. 2 illustrates a conventional package-on-package (PoP) device.
Figure 3:
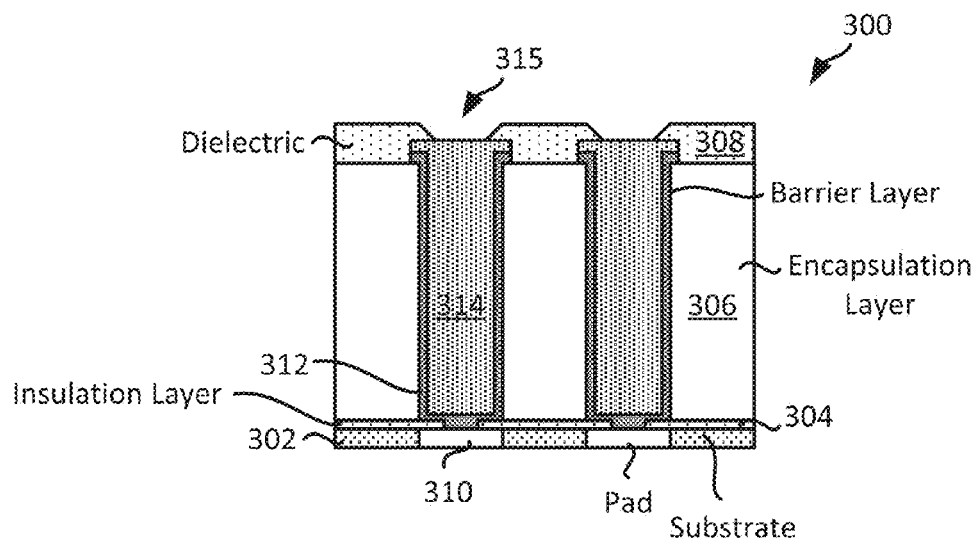
FIG. 3 illustrates an example of a through encapsulation via (TEV) that includes a side barrier layer.

Exemplary Integrated Device that Includes Via with Side Barrier Layer Traversing an Encapsulation Layer FIG. 3 illustrates an example of a set of through encapsulation vias (TEVs) that may be implemented in an integrated device (e.g., integrated package device, package-on-package (PoP) device, interposer).

Specifically, FIG. 3 illustrates a substrate 302, an insulation layer 304, a encapsulation layer 306, and a dielectric layer 308. FIG. 3 also illustrates a first pad 310, a first barrier layer 312, a through encapsulation via (TEV) 314, and a cavity 315. The first pad 310 is located in the substrate 302. Different implementations may use different materials for the substrate 302 (e.g., silicon, glass, ceramic, organic). In some implementations, the substrate 302 is a wafer level substrate.

The first pad 310 is a metal material (e.g., aluminum). The insulation layer 304 is coupled to a first surface (e.g., top surface) of the substrate 302. In some implementations, the insulation layer 304 is a passivation layer. In some implementations, the insulation layer 304 is a dielectric. In some implementations, the insulation layer 304 covers at least partially the first pad 310. Different implementations may use different materials for the insulation layer 304 (e.g., different dielectric materials). In some implementations, the insulation layer 304 is a silicon nitride (SiN) layer.

In some implementations, the encapsulation layer 306 is coupled to the insulation layer 304. For example, a first surface (e.g., bottom surface) of the encapsulation layer 306 is coupled to a second surface (e.g., top surface) of the insulation layer 304. Different implementations may use different materials for the encapsulation layer 306. In some implementations, the encapsulation layer 306 is a film layer. In some implementations, the encapsulation layer 306 is made of a material that has a photo-patternable property. In some implementations, the encapsulation layer 306 is made of a material that can be removed (e.g., etched) through a photo etching process. In some implementations, a photo-etching process on the encapsulation layer 306 ensures that other component of the package does not get damaged when the a cavity is formed (e.g., created) in the encapsulation layer 306 in the process of forming a TEV. For example, in some implementations, the use of a photo-etching process on the encapsulation layer 306 that is photo-patternable ensures that the pad 310 does not get damaged, which would be the case if a laser where used to create a cavity in the encapsulation layer 306. For instances, when a laser process is used to create the cavity in the encapsulation layer over a pad (e.g., pad 310), the laser will damage and/or destroy the pad (e.g., pad 310), which would prevent the TEV from properly coupling to the interconnects in the substrate.

The first barrier layer 312 and the TEV 314 are located in the encapsulation layer 306. The TEV 314 is a metal layer (e.g., copper) that traverses the encapsulation layer 306. In some implementations, the TEV 314 includes a seed layer. In such instances, the TEV 314 includes a metal layer (e.g., copper layer) and a seed layer. In some implementations, the seed layer is between the metal layer of the TEV 314 and the barrier layer 312. The TEV 314 has a first side (e.g., bottom side), a second side (e.g., top side), and a third side (e.g., vertical side). In some implementations, the third side of the TEV 314 may be the walls of the TEV 314. In some implementations, the TEV 314 may have a non-horizontal side. For example, the TEV 314 may have a non-perpendicular or non-horizontal side (e.g., diagonal side).

As shown in FIG. 3, the first barrier layer 312 is coupled to the TEV 314. In particular, the TEV 314 is surrounded in the encapsulation layer 306 by the first barrier layer 312. The first barrier layer 312 is coupled to the first side of the TEV 314 and the third side (e.g., vertical side) of the TEV 314. Thus, as shown in FIG. 3, in some implementations, the TEV 314 is not in direct contact (e.g., free of direct contact) with the encapsulation layer 306. Different implementations may use different materials for the first barrier layer 312. In some implementations, the first barrier layer 312 is one of at least titanium (Ti), TiN, and/or TiW. However, the first barrier layer 312 may be other materials and is not limited to the materials listed.

The first barrier layer 312 is coupled to the first pad 310. In some implementations, the first barrier layer 312 is at least partially surrounded by the insulation layer 304.

The dielectric layer 308 is coupled to the encapsulation layer 306. In some implementations, the first surface (e.g., bottom surface) of the dielectric layer 308 is coupled to the second surface (e.g., top surface) of the encapsulation layer 306. In some implementations, a second surface (e.g., top surface) of the dielectric layer 308 may be aligned with the top surface of the TEV 314. In some implementations, the dielectric layer 308 may include a cavity 315 that opens the dielectric layer 308 and exposes part of the top surface of the TEV 314.

As shown in FIG. 3, the TEV 314 is configured in such a way that the TEV 314 is both a via and a pad. In some implementations, the combination of the via and the pad may be referred to as a via structure. In some implementations, the via structure includes the TEV 314 and the first barrier layer 312. In some implementations, the TEV 314 has a T-shape. In some implementations, the first barrier layer 312 has a U-shape.

The via structure that includes the first barrier layer 312 and the TEV 314, as shown in FIG. 3, may be implemented in different integrated devices. In some implementations, the via structure may be implemented in an integrated package device (e.g., package-on-package (PoP) device).

FIG. 3 illustrates that the first pad 310 is embedded in the substrate 302. However, in some implementations, the first pad 310 is located on the surface of the substrate 302.

Figure 4:
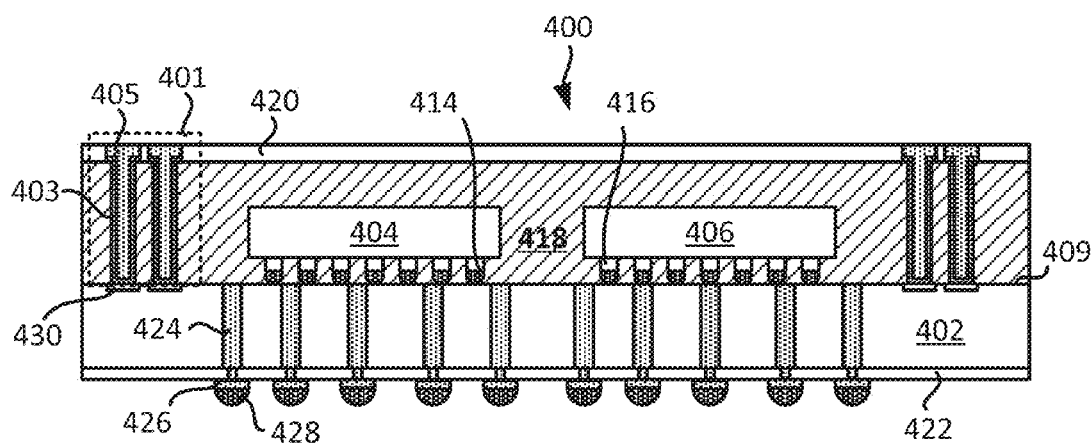
FIG. 4 illustrates an example of an integrated device that includes a through encapsulation via (TEV) with a side barrier layer.

FIG. 4 illustrates an integrated package device 400 that includes a set of via structures 401. In some implementations, the via structures 401 may be the via structure shown in FIG. 3, and/or any novel via structure described and illustrated in the present disclosure.

As shown in FIG. 4, the integrated package device 400 includes a substrate 402, a first die 404, a second die 406, a first set of interconnects 414, a second set of interconnects 416, an encapsulation layer 418, a first dielectric layer 420, a second dielectric layer 422, a set of through substrate vias (TSVs) 424, a third set of interconnects 426, a set of solder balls 428, and a first pad 430. In some implementations, the substrate 402 may include a set of interconnects (e.g., traces, vias), which are not shown for the purpose of clarity. The set of interconnects may be coupled to one or more pads (e.g., pad 430) and/or the third set of interconnects 426.

The first die 404 is coupled the substrate 402 through the first set of interconnects 414 (e.g., first bump, first pillar interconnect, first solder). The second die 406 is coupled the substrate 402 through the second set of interconnects 416 (e.g., second bump, second pillar interconnect, second solder). The encapsulation layer 418 covers the first and second dies 404 and 406.

The set of via structures 401 traverses the encapsulation layer 418 and is coupled to the substrate 402. In some implementations, the set of via structures 401 is coupled to at least the first pad 430. In some implementations, the first pad 430 is coupled to at least one of the set of TSVs 424. At least one of the TSV from the set of TSVs 424 may be coupled to the third set of interconnects 426. At least one interconnect from the third set of interconnects 426 may be coupled to a solder ball from the set of solder balls 428.

In some implementations, a dielectric layer 409 is coupled (e.g., formed) on the first surface of the substrate 402. In some implementations, the dielectric layer 409 is similar and/or the same as the insulation layer 304. In some implementations, the encapsulation layer 418 is coupled to the dielectric layer 409.

One of the via structures 401 includes at least a first barrier layer 403 (e.g., first barrier layer 312) and a through encapsulation via (TEV) 405 (e.g., TEV 314). The first barrier layer 403 and the TEV 405 are located in the encapsulation layer 418. The TEV 405 is a metal layer (e.g., copper) that traverses the encapsulation layer 418. In some implementations, the TEV 405 includes a seed layer. In such instances, the TEV 405 includes a metal layer (e.g., copper layer) and a seed layer. In some implementations, the seed layer is between the metal layer of the TEV 405 and the barrier layer 403. The TEV 405 has a first side (e.g., bottom side), a second side (e.g., top side), and a third side (e.g., vertical side). In some implementations, the third side of the TEV 405 may be the walls of the TEV 405. In some implementations, the vertical side of the TEV 405 is perpendicular to the top and/or bottom surfaces of the encapsulation layer 418.

The first barrier layer 403 is coupled to the TEV 405. In particular, the TEV 405 is surrounded in the encapsulation layer 418 by the first barrier layer 403. The first barrier layer 403 is coupled to the first side of the TEV 405 and the third side (e.g., vertical side) of the TEV 405. Thus, as shown in FIG. 4, in some implementations, the TEV 405 is not in direct contact (e.g., free of direct contact) with the encapsulation layer 418.

FIG. 4 illustrates that the first pad 430 is embedded in the substrate 402. However, in some implementations, the first pad 430 is located on the surface of the substrate 402. Although not show in FIG. 4 for the purpose of clarity, the first pad 430 is coupled to an interconnect (e.g., a via, trace) in the substrate 402.

In some implementations, the integrated device 400 is a package (e.g., integrated package) from a package-on-package (PoP) integrated device. As such, in some implementations, another integrated device (e.g., another package) may be coupled to the integrated device 400. For example, another integrated device comprising a substrate and an interconnect (e.g., solder ball) may be coupled to the top portion of the integrated device 400. In such instances, the interconnect (e.g., solder ball) may be coupled to the via structure 401 of the integrated device 400.

Exemplary Sequence for Providing/Fabricating an Integrated Device that Includes Via with Side Barrier Layer Traversing an Encapsulation Layer In some implementations, providing an integrated device (e.g., integrated package) that includes a via structure, includes several processes. FIG. 5 (which comprises FIGS. 5A-5C) illustrates an exemplary sequence for providing an integrated device. In some implementations, the sequence of FIGS. 5A-5C may be used to provide/manufacture the integrated device of FIGS. 3 and/or 4, and/or other integrated devices described in the present disclose.

It should also be noted that the sequence of FIGS. 5A-5C may be used to provide/manufacture integrated devices that also include circuit elements. It should further be noted that the sequence of FIGS. 5A-5C may combine one or more stages in order to simplify and/or clarify the sequence for providing an integrated device.

In some implementations, the process of FIGS. 5A-5C illustrates a novel process that provides an integrated device with high density interconnects.

As shown in stage 1 of FIG. 5A, a substrate 502 is provided (e.g., fabricated). In some implementations, the substrate 502 is a wafer. Different implementations may use different materials for the substrate (e.g., silicon substrate, glass substrate, ceramic substrate, organic substrate). The substrate 502 includes a set of through substrate vias (TSVs) 504 and a set of pads 505. In some implementations, the substrate 502 may also include other interconnects (e.g., traces). The set of pads 505 is located on a first surface (e.g., top surface) of the substrate 502. In some implementations, the set of pads 505 is embedded in the first surface of the substrate 502. In some implementations, a dielectric layer 503 is coupled (e.g., formed) on the first surface of the substrate 502. In some implementations, the dielectric layer 503 is similar and/or the same as the insulation layer 304. The dielectric layer 503 may include one or more openings and/or cavities above one or more pads 505 and/or one or more set of TSVs 504. In some implementations, the substrate 502 may include a set of interconnects (e.g., traces, vias), which are not shown for the purpose of clarity. The set of interconnects may be coupled to one or more pads (e.g., pad 505).

At stage 2, a first die 506 and a second die 508 are coupled to the substrate 502. The first die 506 is coupled to the substrate 502 through a first set of interconnects 516 (e.g., first pillar, first solder). In some implementations, at least one of the first set of interconnects is electrically coupled to at least one TSV from the set of TSVs 504. The second die 508 is coupled to the substrate 502 through a second set of interconnects 518 (e.g., first pillar, first solder). In some implementations, at least one of the second set of interconnects 518 is electrically coupled to at least one TSV from the set of TSVs 504.

At stage 3, an encapsulation layer 520 is provided (e.g., formed) on the substrate 502 and/or the dielectric layer 503 on the substrate 502. The encapsulation layer 520 encapsulates the first die 506 and the second die 508. In some implementations, the encapsulation layer 520 may be coupled directly to the substrate 502. Different implementations may use different materials for the encapsulation layer 520. In some implementations, the encapsulation layer 520 is a film layer. In some implementations, the encapsulation layer 520 is made of a material that has a photo-patternable property.

At stage 4, at least one cavity 525 is formed in the encapsulation layer 520. In some implementations, the cavity 525 is formed (e.g., created) over a pad (e.g., pad 505). In some implementations, the cavity 525 is formed by using a photo etching process (e.g., photolithography process).

At stage 5, a barrier layer 530 is provided (e.g., formed, deposited). In some implementations, a plating process is used to form the barrier layer 530. The barrier layer 530 may cover the inside walls of the cavity 525, at least part of the pad 505, and/or the first surface of the encapsulation layer 520. Different implementations may use different materials for the barrier layer 530. In some implementations, the barrier layer 530 is one of at least titanium (Ti), (TiN), Aluminium Copper (AlCu), tinanium copper alloy (TiCu) and/or titanium tungsten copper alloy (TiWCu). However, different implementations may use different materials. As such, the material for the barrier layer 530 should not be limited to the materials listed above.

A seed layer 532 is also provided (e.g., formed, deposited) on the barrier layer 530. In some implementations, a plating process is used to form the seed layer 532 on the barrier layer 530. Different implementations may use different materials for the seed layer 532. In some implementations, the seed layer 532 is a metal layer.

At stage 6, a photo resist layer 534 is provided (e.g., formed, deposited) on the seed layer 532. In some implementations, providing the photo resist layer 534 includes providing the photo resist layer 534 and selectively removing some portions of the photo resist layer 534.

At stage 7, a metal layer 536 is provided (e.g., formed, deposited) on the seed layer 532. In some implementations, the metal layer 536 is provided on the seed layer 532 that is not covered by the photo resist layer 534. In some implementations, a lithography and plating process is used to provide the metal layer 536 on the seed layer 532. In some implementations, the metal layer 536 and the seed layer 532 are the same material. Thus, in some implementations, the metal layer 536 may include the seed layer 532.

At stage 8, the photo resist layer 534, the seed layer 532, and the barrier layer 530 are selectively removed (e.g., etched). In some implementations, the photo resist layer 534, the seed layer 532, and the barrier layer 530 are removed concurrently. In some implementations, the photo resist layer 534, the seed layer 532, and the barrier layer 530 are removed sequentially. As shown at stage 8, a via structure 538 is fabricated after the photo resist layer 534, the seed layer 532, and the barrier layer 530 are selectively removed. In some implementations, the via structure 538 is one of the via structures described in FIGS. 3-4.

At stage 9, a dielectric layer 540 is optionally provided (e.g., formed) on a second surface of the encapsulation layer 520. In some implementations, a surface of the dielectric layer 540 is aligned with the surface of the via structure 538. In some implementations, the dielectric layer 540 may cover the via structure 538 and a cavity may be formed over a portion of the via structure 538.

At stage 10, another dielectric layer 550 is optionally provided (e.g., formed) on the second surface (e.g., bottom surface) of the substrate 502. In addition, a set of interconnects 552 are also provided on/in the dielectric layer 550. In some implementations, the set of interconnects 552 includes at least one of a redistribution layer and/or an under bump metallization (UBM) layer. In some implementations, at least one interconnect from the set of interconnects 552 is electrically coupled to at least one TSV from the set of TSVs 504.

At stage 11, a set of solder ball 554 is coupled to the set of interconnects 552. In some implementations, after stage 10, an integrated device 560 is fabricated that includes an encapsulation layer and a via structure that includes a side barrier layer.

Exemplary Integrated Device that Includes Via with Side Barrier Layer Traversing an Encapsulation Layer FIG. 6 illustrates an integrated package device that includes a set of via structures 610. Specifically, FIG. 6 illustrates an example of an interposer 600 that includes a set of via structures 610. In some implementations, the via structures 610 may be the via structure shown in FIG. 3, and/or any novel via structure described and illustrated in the present disclosure.

As shown in FIG. 6, the interposer 600 includes an encapsulation layer 602, a first dielectric layer 604, a substrate 606, a first pad 608, and the set of via structures 610. The first dielectric layer 604 is coupled to a first surface (e.g., top surface) of the encapsulation layer 602. The substrate 606 is coupled to a second surface (e.g., bottom surface) of the encapsulation layer 602. In some implementations, a second dielectric layer (e.g., encapsulation layer 304) may be positioned between the substrate 606 and the second surface of the encapsulation layer 602.

The set of via structures 610 traverses the encapsulation layer 602. In some implementations, the set of via structures 610 is coupled to at least the first pad 608. One of the via structures 610 includes at least a barrier layer 612 and a through encapsulation via (TEV) 614. The bather layer 612 and the TEV 614 are located in the encapsulation layer 602. In some implementations, the barrier layer 612 is coupled to (e.g., is in direct contact with) the pad 608. The TEV 614 is a metal layer (e.g., copper) that traverses the encapsulation layer 602. In some implementations, the TEV 614 includes a seed layer. In such instances, the TEV 614 includes a metal layer (e.g., copper layer) and a seed layer. In some implementations, the seed layer is between the metal layer of the TEV 614 and the barrier layer 612. The TEV 614 has a first side (e.g., bottom side), a second side (e.g., top side), and a third side (e.g., vertical side). In some implementations, the third side of the TEV 614 may be the walls of the TEV 614. In some implementations, the vertical side of the TEV 614 is perpendicular to the top and/or bottom surfaces of the encapsulation layer 602.

The barrier layer 612 is coupled to the TEV 614. In particular, the TEV 614 is surrounded in the encapsulation layer 602 by the barrier layer 612. The barrier layer 612 is coupled to the first side of the TEV 614 and the vertical side of the TEV 614. Thus, as shown in FIG. 6, in some implementations, the TEV 614 is not in direct contact (e.g., free of direct contact) with the encapsulation layer 602.

Exemplary Sequence for Providing/Fabricating an Integrated Device that Includes Via with Side Barrier Layer Traversing an Encapsulation Layer In some implementations, an integrated device may include an interposer. In some implementations, providing an integrated device (e.g., integrated package) that includes a via structure several processes. FIG. 7 (which includes FIGS. 7A-7C) illustrates an exemplary sequence for providing an integrated device. In some implementations, the sequence of FIGS. 7A-7C may be used to provide/manufacture the integrated device of FIGS. 3, 4 and/or 6, and/or other integrated devices described in the present disclose.

It should further be noted that the sequence of FIGS. 7A-7C may combine one or more stages in order to simplify and/or clarify the sequence for providing an integrated device.

In some implementations, the process of FIGS. 7A-7C illustrates a novel process that provides an integrated device (e.g., interposer) with high density interconnects.

As shown in stage 1 of FIG. 7A, a carrier 702 is provided (e.g., fabricated). In some implementations, the carrier 702 is one of at least a substrate and/or wafer. Different implementations may use different materials for the carrier (e.g., silicon substrate, glass substrate, ceramic substrate, organic substrate). The carrier 702 includes a set of pads 705. In some implementations, the carrier 702 may also include other interconnects (e.g., traces). The set of pads 705 is embedded in a first surface (e.g., top surface) of the carrier 702. In some implementations, the set of pads 705 is located on the first surface (e.g., top surface) of the carrier 702. In some implementations, a dielectric layer 703 is coupled (e.g., formed) on the first surface of the substrate 704. In some implementations, the dielectric layer is similar and/or the same as the insulation layer 304.

At stage 2, an encapsulation layer 720 is provided (e.g., formed) on the carrier 702 and/or the dielectric layer 703 on the carrier 702. In some implementations, the encapsulation layer 720 encapsulates the pads 705. In some implementations, the encapsulation layer 720 may be coupled directly to the carrier 702. Different implementations may use different materials for the encapsulation layer 720. In some implementations, the encapsulation layer 720 is a film layer. In some implementations, the encapsulation layer 720 is made of a material that has a photo-patternable property. In some implementations, the encapsulation layer 720 is made of a material that can be removed (e.g., etched) through a photo etching process.

At stage 3, at least one cavity 725 is formed in the encapsulation layer 720. In some implementations, the cavity 725 is formed (e.g., created) over a pad (e.g., pad 705). In some implementations, the cavity 725 is formed by using a photo etching process (e.g., photolithography process).

At stage 4, a barrier layer 730 is provided (e.g., formed, deposited). In some implementations, a plating process is used to form the barrier layer 730. The barrier layer 730 may cover the inside walls of the cavity 725, at least part of the pad 705, and/or the first surface of the encapsulation layer 720. Different implementations may use different materials for the barrier layer 730. Different implementations may use different materials for the barrier layer 730. In some implementations, the barrier layer 730 is one of at least titanium (Ti), (TIN), Aluminium Copper (AlCu), tinanium copper alloy (TiCu) and/or titanium tungsten copper alloy (TiWCu).

A seed layer 732 is also provided (e.g., formed, deposited) on the barrier layer 730. In some implementations, a plating process is used to form the seed layer 732 on the barrier layer 730. Different implementations may use different materials for the seed layer 732. In some implementations, the seed layer 732 is a metal layer.

At stage 5, a photo resist layer 734 is provided (e.g., formed, deposited) on the seed layer 732. In some implementations, providing the photo resist layer 734 includes providing the photo resist layer 734 and selectively removing some portions of the photo resist layer 734.

At stage 6, a metal layer 736 is provided (e.g., formed, deposited) on the seed layer 732. In some implementations, the metal layer 736 is provided on the seed layer 732 that is not covered by the photo resist layer 734. In some implementations, a lithography and plating process is used to provide the metal layer 736 on the seed layer 732. In some implementations, the metal layer 736 and the seed layer 732 are the same material. Thus, in some implementations, the metal layer 736 may include the seed layer 732.

At stage 7, the photo resist layer 734, the seed layer 732, and the barrier layer 730 are selectively removed (e.g., etched). In some implementations, the photo resist layer 734, the seed layer 732, and the barrier layer 730 are removed concurrently. the photo resist layer 734, the seed layer 732, and the barrier layer 730 are removed sequentially. As shown at stage 7, a via structure 738 is fabricated after the photo resist layer 734, the seed layer 732, and the barrier layer 730 are selectively removed. In some implementations, the via structure 738 is one of the via structures described in FIGS. 3-4.

At stage 8, a dielectric layer 740 is optionally provided (e.g., formed) on a second surface of the encapsulation layer 720. In some implementations, a surface of the dielectric layer 740 is aligned with the surface of the via structure 738. In some implementations, the dielectric layer 740 may cover the via structure 738 and a cavity may be formed over a portion of the via structure 738.

At stage 8, at least a portion of the carrier 702 is removed (e.g., polish, grinded, etched). In some implementations, the carrier 702 is removed until a surface of the carrier 702 is aligned with a surface of the pad 705. In some implementations, after stage 9, an integrated device 760 is fabricated that includes an encapsulation layer and a via structure that includes a side barrier layer.

Exemplary Integrated Device that Includes Via with Side Barrier Layer and Fill Traversing an Encapsulation Layer FIG. 8 illustrates an example of a set of through encapsulation vias (TEVs) that may be implemented in an integrated device (e.g., integrated package device, package-on-package (PoP) device, interposer).

Specifically, FIG. 8 illustrates a substrate 802, an insulation layer 804, a encapsulation layer 806, and a dielectric layer 808. FIG. 8 also illustrates a first pad 810, a first barrier layer 812, a through encapsulation via (TEV) 814, a fill 816, and a cavity 817. The first pad 810 is located in the substrate 802. Different implementations may use different materials for the substrate 802 (e.g., silicon, glass, ceramic, organic). In some implementations, the substrate 802 is a wafer level substrate.

The first pad 810 is a metal material (e.g., aluminum). The insulation layer 804 is coupled to a first surface (e.g., top surface) of the substrate 802. In some implementations, the insulation layer 804 is a passivation layer. In some implementations, the insulation layer 304 is a dielectric. In some implementations, the insulation layer 804 covers at least partially the first pad 810. Different implementations may use different materials for the insulation layer 804 (e.g., different dielectric materials). In some implementations, the insulation layer 804 is a silicon nitrade (SiN) layer.

In some implementations, the encapsulation layer 806 is coupled to the insulation layer 804. For example, a first surface (e.g., bottom surface) of the encapsulation layer 806 is coupled to a second surface (e.g., top surface) of the insulation layer 804. Different implementations may use different materials for the encapsulation layer 806. In some implementations, the encapsulation layer 806 is a film layer. In some implementations, the encapsulation layer 806 is made of a material that has a photo-patternable property. In some implementations, the encapsulation layer 806 is made of a material that can be removed (e.g., etched) through a photo etching process. In some implementations, a photo-etching process on the encapsulation layer 806 ensures that other component of the package does not get damaged when the a cavity is formed (e.g., created) in the encapsulation layer 806 in the process of forming a TEV. For example, in some implementations, the use of a photo-etching process on the encapsulation layer 806 that is photo-patternable ensures that the pad 810 does not get damaged, which would be the case if a laser where used to create a cavity in the encapsulation layer 806. For instances, when a laser process is used to create the cavity in the encapsulation layer over a pad (e.g., pad 810), the laser will damage and/or destroy the pad (e.g., pad 810), which would prevent the TEV from properly coupling to the interconnects in the substrate.

The first barrier layer 812, the TEV 814 and the fill 816 are located in the encapsulation layer 806. The TEV 814 is a metal layer (e.g., copper) that traverses the encapsulation layer 806. In some implementations, the TEV 814 includes a seed layer. In such instances, the TEV 814 includes a metal layer (e.g., copper layer) and a seed layer. In some implementations, the seed layer is between the metal layer of the TEV 814 and the barrier layer 812. The TEV 814 has a first side (e.g., bottom side), a second side (e.g., top side), and a third side (e.g., vertical side). In some implementations, the third side of the TEV 814 may be the walls of the TEV 814. In some implementations, the TEV 814 may have a non-horizontal side. For example, the TEV 814 may have a non-perpendicular or non-horizontal side (e.g., diagonal side). Different implementations may use different materials for the fill 816. For example, the fill 816 may include a polymer fill. In some implementations, the fill 816 provides structure stability for the via structure.

FIG. 8 illustrates that the TEV 814 conforms to the shape of the barrier layer 812. In this example, the barrier layer 812 has a U shaped cross-section. Similarly, the TEV 814 has a U shaped cross-section. FIG. 8 also illustrates that the fill 816 is coupled to the TEV 814. In particular, the fill 816 is surrounded by the TEV 814. The first barrier layer 812 is coupled to the TEV 814. In particular, the TEV 814 is surrounded in the encapsulation layer 806 by the first barrier layer 812. The first barrier layer 812 is coupled to the first side of the TEV 814 and the third side (e.g., vertical side) of the TEV 814. Thus, as shown in FIG. 8, in some implementations, the TEV 814 is not in direct contact (e.g., free of direct contact) with the encapsulation layer 806. Different implementations may use different materials for the first barrier layer 812. In some implementations, the first barrier layer 812 is one of at least titanium (Ti), TiN, and/or TiW. However, the first barrier layer 812 may be other materials and is not limited to the materials listed.

The first barrier layer 812 is coupled to the first pad 810. In some implementations, the first barrier layer 812 is at least partially surrounded by the insulation layer 804.

The dielectric layer 808 is coupled to the encapsulation layer 806. In some implementations, the first surface (e.g., bottom surface) of the dielectric layer 808 is coupled to the second surface (e.g., top surface) of the encapsulation layer 806. In some implementations, the dielectric layer 808 may include a cavity 817 that opens the dielectric layer 808 and exposes part of the top surface of the TEV 814. As shown in FIG. 8, the cavity 817 exposes the wing portion (e.g., horizontal portion) of the TEV 814.

As shown in FIG. 8, the TEV 814 is configured in such a way that the TEV is both a via and a pad. In some implementations, the combination of the via and the pad may be referred to as a via structure. In some implementations, the via structure includes the TEV 814 and the first barrier layer 812.

The via structure that includes the first barrier layer 812 and the TEV 814, as shown in FIG. 8, may be implemented in different integrated devices. In some implementations, the via structure may be implemented in an integrated package device (e.g., package-on-package (PoP) device).

FIG. 8 illustrates that the first pad 810 is embedded in the substrate 802. However, in some implementations, the first pad 810 is located on the surface of the substrate 802.

FIG. 9 illustrates an integrated package device 900 that includes a set of via structures 901. In some implementations, via structures 901 may be the via structure shown in FIG. 8, and/or any novel via structure described and illustrated in the present disclosure.

As shown in FIG. 9, the integrated package device 900 includes a substrate 902, a first die 904, a second die 906, a dielectric layer 909, a first set of interconnects 914, a second set of interconnects 916, an encapsulation layer 918, a first dielectric layer 920, a second dielectric layer 922, a set of through substrate vias (TSVs) 924, a third set of interconnects 926, a set of solder balls 928, and a first pad 930. In some implementations, the substrate 902 may include a set of interconnects (e.g., traces, vias), which are not shown for the purpose of clarity. The set of interconnects may be coupled to one or more pads (e.g., pad 930) and/or the third set of interconnects 926.

The first die 904 is coupled the substrate 902 through the first set of interconnects 914 (e.g., first pillar, first solder). The second die 906 is coupled the substrate 902 through the second set of interconnects 916 (e.g., second pillar, second solder). The encapsulation layer 918 covers the first and second dies 904 and 906.

The set of via structures 901 traverses the encapsulation layer 918 and is coupled to the substrate 902. In some implementations, the set of via structures 901 is coupled to at least the first pad 930. In some implementations, the first pad 930 is coupled to at least one of the set of TSVs 924. At least one of the TSV from the set of TSVs 924 may be coupled to the third set of interconnects 926. At least one interconnect from the third set of interconnects 926 may be coupled to a solder ball from the set of solder balls 928.

In some implementations, a dielectric layer 909 is coupled (e.g., formed) on the first surface of the substrate 902. In some implementations, the dielectric layer 909 is similar and/or the same as the insulation layer 804. In some implementations, the encapsulation layer 918 is coupled to the dielectric layer 909.

One of the via structures 901 includes at least a first barrier layer 903 (e.g., first barrier layer 812), a through encapsulation via (TEV) 905 (e.g., TEV 814) and a fill 907. The first barrier layer 903, the TEV 905, and the fill 907 are located in the encapsulation layer 918. The TEV 905 is a metal layer (e.g., copper) that traverses the encapsulation layer 918. In some implementations, the TEV 905 includes a seed layer. In such instances, the TEV 905 includes a metal layer (e.g., copper layer) and a seed layer. In some implementations, the seed layer is between the metal layer of the TEV 905 and the barrier layer 903. The TEV 905 has a first side (e.g., bottom side), a second side (e.g., top side), and a third side (e.g., vertical side). In some implementations, the third side of the TEV 905 may be the walls of the TEV 905. In some implementations, the vertical side of the TEV 905 is perpendicular to the top and/or bottom surfaces of the encapsulation layer 918. Different implementations may use different materials for the fill 907. For example, the fill 907 may include a polymer fill. In some implementations, the fill 907 provides structural stability for the via structure 901.

The first barrier layer 903 is coupled to the TEV 905. In particular, the TEV 905 is surrounded in the encapsulation layer 918 by the first barrier layer 903. The first barrier layer 903 is coupled to the first side of the TEV 905 and the third side (e.g., vertical side) of the TEV 905. Thus, as shown in FIG. 9, in some implementations, the TEV 905 is not in direct contact (e.g., free of direct contact) with the encapsulation layer 918. In some implementations, the TEV 905 conforms to the shape of the first bather layer 903. The fill 907 is surrounded by the TEV 905.

FIG. 9 illustrates that the first pad 930 is embedded in the substrate 902. However, in some implementations, the first pad 930 is located on the surface of the substrate 902. Although not show in FIG. 9 for the purpose of clarity, the first pad 930 is coupled to an interconnect (e.g., a via, trace) in the substrate 902.

In some implementations, the integrated device 900 is a package (e.g., integrated package) from a package-on-package (PoP) integrated device. As such, in some implementations, another integrated device (e.g., another package) may be coupled to the integrated device 900. For example, another integrated device comprising a substrate and an interconnect (e.g., solder ball) may be coupled to the top portion of the integrated device 900. In such instances, the interconnect (e.g., solder ball) may be coupled to the via structure 901 of the integrated device 900.

Exemplary Sequence for Providing/Fabricating an Integrated Device that Includes Via with Side Barrier Layer and Fill Traversing an Encapsulation Layer In some implementations, providing an integrated device (e.g., integrated package) that includes a via structure several processes. FIG. 10 (which includes FIGS. 10A-10C) illustrates an exemplary sequence for providing an integrated device. In some implementations, the sequence of FIGS. 10A-10C may be used to provide/manufacture the integrated device of FIGS. 8 and/or 9, and/or other integrated devices described in the present disclose.

It should also be noted that the sequence of FIGS. 10A-10C may be used to provide/manufacture integrated devices that also include circuit elements. It should further be noted that the sequence of FIGS. 10A-10C may combine one or more stages in order to simplify and/or clarify the sequence for providing an integrated device.

In some implementations, the process of FIGS. 10A-10C illustrates a novel process that provides an integrated device with high density interconnects.

As shown in stage 1 of FIG. 10A, a substrate 1002 is provided (e.g., fabricated). In some implementations, the substrate 1002 is a wafer. Different implementations may use different materials for the substrate (e.g., silicon substrate, glass substrate, ceramic substrate, organic substrate). The substrate 1002 includes a set of through substrate vias (TSVs) 1004 and a set of pads 1005. In some implementations, the substrate 1002 may also include other interconnects (e.g., traces). The set of pads 1005 is embedded in a first surface (e.g., top surface) of the substrate 1002. In some implementations, the set of pads 1005 is located on the first surface (e.g., top surface) of the substrate 1002. In some implementations, a dielectric layer 1003 is coupled (e.g., formed) on the first surface of the substrate 1002. In some implementations, the dielectric layer 1003 is similar and/or the same as the insulation layer 304. The dielectric layer 1003 may include one or more openings and/or cavities above one or more pads 1005 and/or one or more set of TSVs 1004. In some implementations, the substrate 1002 may include a set of interconnects (e.g., traces, vias), which are not shown for the purpose of clarity. The set of interconnects may be coupled to one or more pads (e.g., pad 1005).

At stage 2, a first die 1006 and a second die 1008 are coupled to the substrate 1002. The first die 1006 is coupled to the substrate 1002 through a first set of interconnects 1016 (e.g., first pillar, first solder). In some implementations, at least one of the first set of interconnects is electrically coupled to at least one TSV from the set of TSVs 1004. The second die 1008 is coupled to the substrate 1002 through a second set of interconnects 1018 (e.g., first pillar, first solder). In some implementations, at least one of the second set of interconnects 1018 is electrically coupled to at least one TSV from the set of TSVs 1004.

At stage 3, an encapsulation layer 1020 is provided (e.g., formed) on the substrate 1002 and/or the dielectric layer 1003 on the substrate 1002. The encapsulation layer 1020 encapsulates the first die 1006 and the second die 1008. In some implementations, the encapsulation layer 1020 may be coupled directly to the substrate 1002. Different implementations may use different materials for the encapsulation layer 1020. In some implementations, the encapsulation layer 1020 is a film layer. In some implementations, the encapsulation layer 1020 is made of a material that has a photo-patternable property.

At stage 4, at least one cavity 1025 is formed in the encapsulation layer 1020. In some implementations, the cavity 1025 is formed (e.g., created) over a pad (e.g., pad 1005). In some implementations, the cavity 1025 is formed by using a photo etching process (e.g., photolithography process).

At stage 5, a barrier layer 1030 is provided (e.g., formed, deposited). In some implementations, a plating process is used to form the barrier layer 1030. The barrier layer 1030 may cover the inside walls of the cavity 1025, at least part of the pad 1005, and/or the first surface of the encapsulation layer 1020. Different implementations may use different materials for the barrier layer 1030. In some implementations, the barrier layer 1030 is one of at least titanium (Ti), (TiN), Aluminium Copper (AlCu), tinanium copper alloy (TiCu) and/or titanium tungsten copper alloy (TiWCu). However, different implementations may use different materials. As such, the material for the barrier layer 1030 should not be limited to the materials listed above.

A seed layer 1032 is also provided (e.g., formed, deposited) on the barrier layer 1030. In some implementations, a plating process is used to form the seed layer 1032 on the barrier layer 1030. Different implementations may use different materials for the seed layer 1032. In some implementations, the seed layer 1032 is a metal layer.

At stage 6, a photo resist layer 1034 is provided (e.g., formed, deposited) on the seed layer 1032. In some implementations, providing the photo resist layer 1034 includes providing the photo resist layer 1034 and selectively removing some portions of the photo resist layer 1034.

At stage 7, a metal layer 1036 is provided (e.g., formed, deposited) on the seed layer 1032. In some implementations, the metal layer 1036 is provided on the seed layer 1032 that is not covered by the photo resist layer 1034. In some implementations, a lithography and plating process is used to provide the metal layer 1036 on the seed layer 1032. In some implementations, the metal layer 1036 and the seed layer 1032 are the same material. Thus, in some implementations, the metal layer 1036 may include the seed layer 1032. As shown in stage 7, the metal layer 1036 is provided on the seed layer 1032 such that it conforms (e.g., contours) with the barrier layer 1030. Stage 7 also illustrates that the metal layer 1036 does not completely fill the cavity 1025, leaving behind a cavity 1037.

At stage 8, a fill 1039 is provided in the cavity 1037. Different implementations may provide different materials for the fill 1039. For example, the fill 1039 may includes a polymer fill. In some implementations, the fill 1039 is configured to provide structural stability for a via structure.

At stage 9, the photo resist layer 1034, the seed layer 1032, and the barrier layer 1030 are selectively removed (e.g., etched). In some implementations, the photo resist layer 1034, the seed layer 1032, and the barrier layer 1030 are removed concurrently. In some implementations, the photo resist layer 1034, the seed layer 1032, and the barrier layer 1030 are removed sequentially. As shown at stage 9, a via structure 1038 is fabricated after the photo resist layer 1034, the seed layer 1032, and the barrier layer 1030 are selectively removed. In some implementations, the via structure 1038 is one of the via structures described in FIGS. 8-9.

At stage 10, a dielectric layer 1040 is optionally provided (e.g., formed) on a second surface of the encapsulation layer 1020. In some implementations, a surface of the dielectric layer 1040 is aligned with the surface of the via structure

1038. In some implementations, the dielectric layer 1040 may cover the via structure 1038 and a cavity may be formed over a portion of the via structure 1038.

At stage 11, another dielectric layer 1050 is optionally provided (e.g., formed) on the second surface (e.g., bottom surface) of the substrate 1002. In addition, a set of interconnects 1052 are also provided on/in the dielectric layer 1050. In some implementations, the set of interconnects 1052 includes at least one of a redistribution layer and/or an under bump metallization (UBM) layer. In some implementations, at least one interconnect from the set of interconnects 1052 is electrically coupled to at least one TSV from the set of TSVs 1004.

At stage 12, a set of solder ball 1054 is coupled to the set of interconnects 1052. In some implementations, after stage 10, an integrated device 1060 is fabricated that includes an encapsulation layer and a via structure that includes a side barrier layer.

Exemplary Integrated Device that Includes Via with Side Barrier Layer and Fill Traversing an Encapsulation Layer FIG. 11 illustrates an integrated package device that includes a set of via structures 1110. Specifically, FIG. 11 illustrates an example of an interposer 1100 that includes a set of via structures 1110. In some implementations, the via structures 1110 may be the via structure shown in FIG. 8, and/or any novel via structure described and illustrated in the present disclosure.

As shown in FIG. 11, the interposer 1100 includes an encapsulation layer 1102, a first dielectric layer 1104, a substrate 1106, a first pad 1108, and a set of via structures 1110. The first dielectric layer 1104 is coupled to a first surface (e.g., top surface) of the encapsulation layer 1102. The substrate 1106 is coupled to a second surface (e.g., bottom surface) of the encapsulation layer 1102. In some implementations, a second dielectric layer (e.g., encapsulation layer 304) may be positioned between the substrate 1106 and the second surface of the encapsulation layer 1102.

The set of via structures 1110 traverses the encapsulation layer 1102. In some implementations, the set of via structures 1110 is coupled to at least the first pad 1108. One of the via structures 1110 includes at least a barrier layer 1112, a through encapsulation via (TEV) 1114 and a fill 1116. The barrier layer 1112, the TEV 1114, and the fill 1116 are located in the encapsulation layer 1102. In some implementations, the barrier layer 1112 is coupled to (e.g., is in direct contact with) the pad 1108. The TEV 1114 is a metal layer (e.g., copper) that traverses the encapsulation layer 1102. In some implementations, the TEV 1114 includes a seed layer. In such instances, the TEV 1114 includes a metal layer (e.g., copper layer) and a seed layer. In some implementations, the seed layer is between the metal layer of the TEV 1114 and the barrier layer 1112. The TEV 1114 has a first side (e.g., bottom side), a second side (e.g., top side), and a third side (e.g., vertical side). In some implementations, the third side of the TEV 1114 may be the walls of the TEV 1114. In some implementations, the TEV 1114 may have a non-horizontal side. For example, the TEV 1114 may have a non-perpendicular or non-horizontal side (e.g., diagonal side). Different implementations may use different materials for the fill 1116. For example, the fill 1116 may include a polymer fill. In some implementations, the fill 1116 provides structure stability for the via structure.

FIG. 11 illustrates that the TEV 1114 conforms to the shape of the barrier layer 1112. In this example, the barrier layer 1112 has a U shaped cross-section. Similarly, the TEV 1114 has a U shaped cross-section. FIG. 11 also illustrates that the fill 1116 is coupled to the TEV 1114. In particular, the fill 1116 is surrounded by the TEV 1114. The first barrier layer 1112 is coupled to the TEV 1114. In particular, the TEV 1114 is surrounded in the encapsulation layer 1102 by the first barrier layer 1112. The first barrier layer 1112 is coupled to the first side of the TEV 1114 and the third side (e.g., vertical side) of the TEV 1114. Thus, as shown in FIG. 11, in some implementations, the TEV 1114 is not in direct contact (e.g., free of direct contact) with the encapsulation layer 1102. Different implementations may use different materials for the first barrier layer 1112. In some implementations, the first barrier layer 1112 is one of at least titanium (Ti), TiN, and/or TiW. However, the first barrier layer 1112 may be other materials and is not limited to the materials listed.

Exemplary Sequence for Providing/Fabricating an Integrated Device that Includes Via with Side Barrier Layer and Fill Traversing an Encapsulation Layer In some implementations, an integrated device may include an interposer. In some implementations, providing an integrated device (e.g., integrated package) that includes a via structure several processes. FIG. 12 (which includes FIGS. 12A-12C) illustrates an exemplary sequence for providing an integrated device. In some implementations, the sequence of FIGS. 12A-12C may be used to provide/manufacture the integrated device of FIGS. 8, 9 and/or 11, and/or other integrated devices described in the present disclose.

Figure 12A:
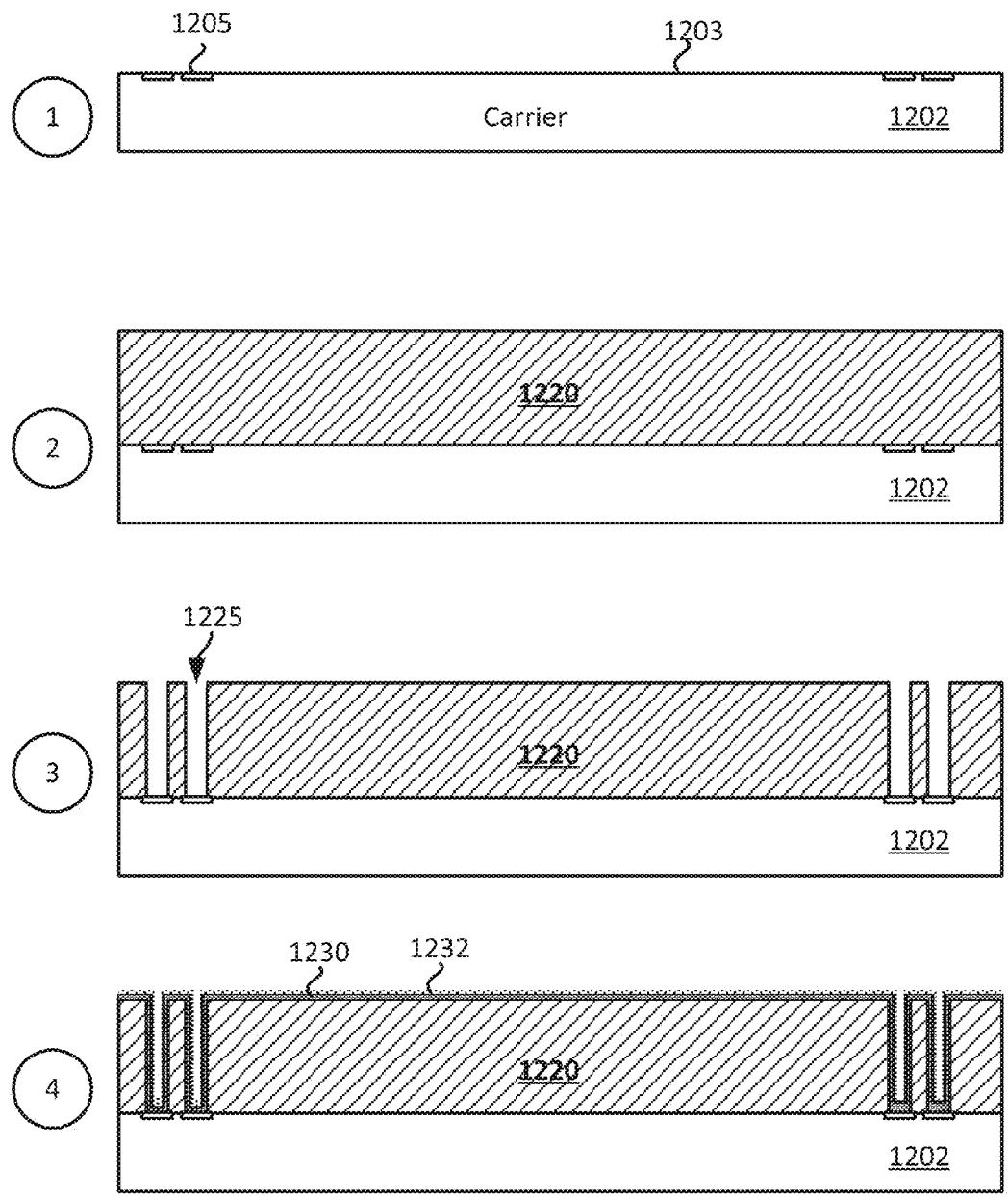
Figure 12B:
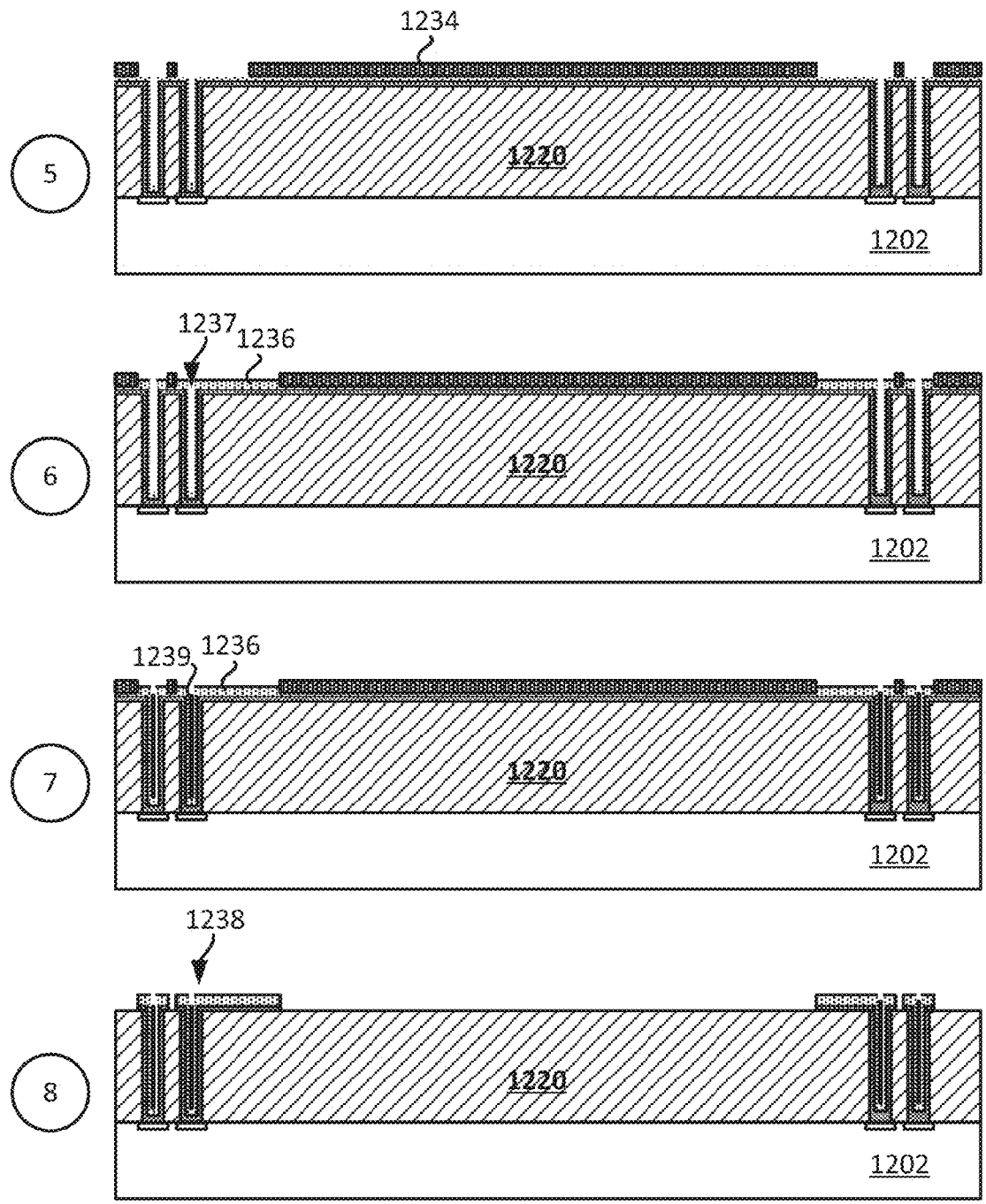
Figure 12C:
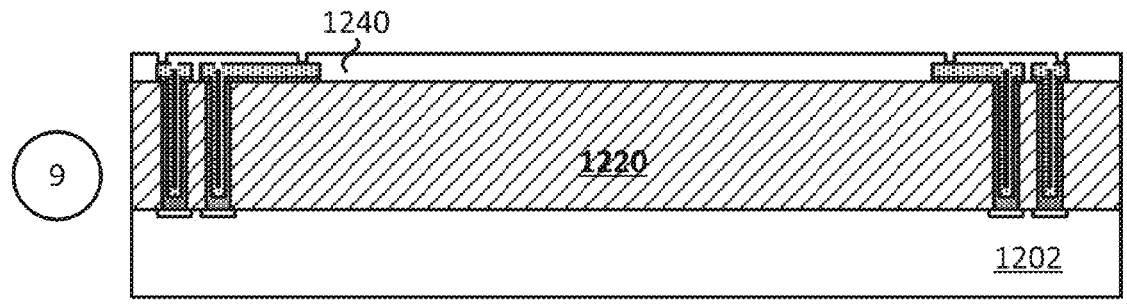
Figure 12C:
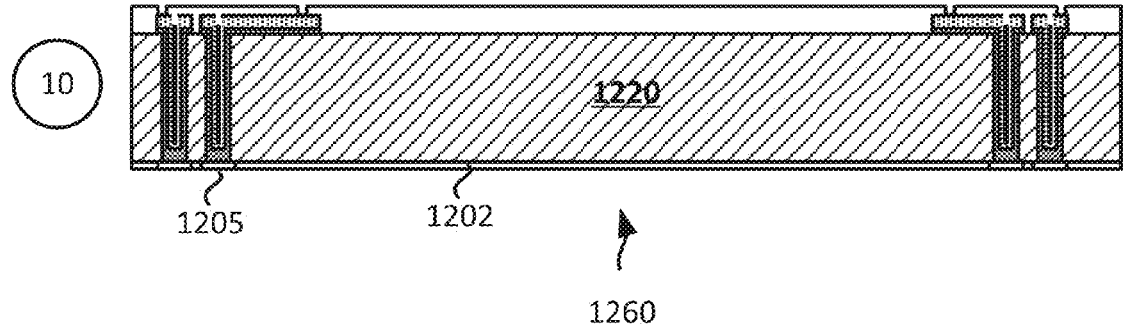

It should further be noted that the sequence of FIGS. 12A-12C may combine one or more stages in order to simplify and/or clarify the sequence for providing an integrated device.

In some implementations, the process of FIGS. 12A-12C illustrates a novel process that provides an integrated device (e.g., interposer) with high density interconnects.

As shown in stage 1 of FIG. 12A, a carrier 1202 is provided (e.g., fabricated). In some implementations, the carrier 1202 is one of at least a substrate and/or wafer. Different implementations may use different materials for the carrier (e.g., silicon substrate, glass substrate, ceramic substrate, organic substrate). The carrier 1202 includes a set of pads 1205. In some implementations, the carrier 1202 may also include other interconnects (e.g., traces). The set of pads 1205 is embedded in a first surface (e.g., top surface) of the carrier 1202. In some implementations, the set of pads 1205 is located on the first surface (e.g., top surface) of the carrier 1202. In some implementations, a dielectric layer 1203 is coupled (e.g., formed) on the first surface of the substrate 1204. In some implementations, the dielectric layer is similar and/or the same as the insulation layer 304.

At stage 2, an encapsulation layer 1220 is provided (e.g., formed) on the carrier 1202 and/or the dielectric layer 1203 on the carrier 1202. In some implementations, the encapsulation layer 1220 encapsulates the pads 1205. In some implementations, the encapsulation layer 1220 may be coupled directly to the carrier 1202. Different implementations may use different materials for the encapsulation layer 1220. In some implementations, the encapsulation layer 1220 is a film layer. In some implementations, the encapsulation layer 1220 is made of a material that has a photo-patternable property. In some implementations, the encapsulation layer 1220 is made of a material that can be removed (e.g., etched) through a photo etching process.

At stage 3, at least one cavity 1225 is formed in the encapsulation layer 1220. In some implementations, the cavity 1225 is formed (e.g., created) over a pad (e.g., pad

1205). In some implementations, the cavity 1225 is formed by using a photo etching process (e.g., photolithography process).

At stage 4, a barrier layer 1230 is provided (e.g., formed, deposited). In some implementations, a plating process is used to form the barrier layer 1230. The barrier layer 1230 may cover the inside walls of the cavity 1225, at least part of the pad 1205, and/or the first surface of the encapsulation layer 1220. Different implementations may use different materials for the barrier layer 1230. Different implementations may use different materials for the barrier layer 1230. In some implementations, the barrier layer 1230 is one of at least titanium (Ti), (TiN), Aluminium Copper (AlCu), tinanium copper alloy (TiCu) and/or titanium tungsten copper alloy (TiWCu).

A seed layer 1232 is also provided (e.g., formed, deposited) on the barrier layer 1230. In some implementations, a plating process is used to form the seed layer 1232 on the barrier layer 1230. Different implementations may use different materials for the seed layer 1232. In some implementations, the seed layer 1232 is a metal layer.

At stage 5, a photo resist layer 1234 is provided (e.g., formed, deposited) on the seed layer 1232. In some implementations, providing the photo resist layer 1234 includes providing the photo resist layer 1234 and selectively removing some portions of the photo resist layer 1234.

At stage 6, a metal layer 1236 is provided (e.g., formed, deposited) on the seed layer 1232. In some implementations, the metal layer 1236 is provided on the seed layer 1232 that is not covered by the photo resist layer 1234. In some implementations, a lithography and plating process is used to provide the metal layer 1236 on the seed layer 1232. In some implementations, the metal layer 1236 and the seed layer 1232 are the same material. Thus, in some implementations, the metal layer 1236 may include the seed layer 1232.

As shown in stage 6, the metal layer 1236 is provided on the seed layer 1232 such that it conforms (e.g., contours) with the barrier layer 1230. Stage 6 also illustrates that the metal layer 1236 does not completely fill the cavity 1225, leaving behind a cavity 1237.

At stage 7, a fill 1239 is provided in the cavity 1237. Different implementations may provide different materials for the fill 1239. For example, the fill 1239 may includes a polymer fill. In some implementations, the fill 1239 is configured to provide structural stability for a via structure.

At stage 8, the photo resist layer 1234, the seed layer 1232, and the barrier layer 1230 are selectively removed (e.g., etched). In some implementations, the photo resist layer 1234, the seed layer 1232, and the barrier layer 1230 are removed concurrently. the photo resist layer 1234, the seed layer 1232, and the barrier layer 1230 are removed sequentially. As shown at stage 12, a via structure 1238 is fabricated after the photo resist layer 1234, the seed layer 1232, and the barrier layer 1230 are selectively removed. In some implementations, the via structure 1238 is one of the via structures described in FIGS. 8-9.

At stage 9, a dielectric layer 1240 is optionally provided (e.g., formed) on a second surface of the encapsulation layer 1220. In some implementations, a surface of the dielectric layer 1240 is aligned with the surface of the via structure 1238. In some implementations, the dielectric layer 1240 may cover the via structure 1238 and a cavity may be formed over a portion of the via structure 1238.

At stage 10, at least a portion of the carrier 1202 is removed (e.g., polish, grinded, etched). In some implementations, the carrier 1202 is removed until a surface of the carrier 1202 is aligned with a surface of the pad 1205. In some implementations, after stage 10, an integrated device 1260 is fabricated that includes an encapsulation layer and a via structure that includes a side barrier layer.

Exemplary Method for Providing/Fabricating an Integrated Device that Includes Via with Side Barrier Layer Traversing an Encapsulation Layer In some implementations, providing an integrated device (e.g., integrated package) that includes a via structure several processes. FIG. 13 illustrates a method for providing an integrated device. In some implementations, the method of FIG. 13 may be used to provide/manufacture the integrated device of FIGS. 3, 4, 8 and/or 9, and/or other integrated devices described in the present disclose.

It should also be noted that the method of FIG. 13 may be used to provide/manufacture integrated devices that also include circuit elements. It should further be noted that the method of FIG. 13 may combine one or more stages in order to simplify and/or clarify the sequence for providing an integrated device.

In some implementations, the process of FIG. 13 illustrates a novel process that provides an integrated device with high density interconnects.

The method provides (at 1305) a substrate. In some implementations, providing a substrate may include form and/or fabricating a substrate (e.g., substrate 502). In some implementations, the substrate is a wafer. Different implementations may use different materials for the substrate (e.g., silicon substrate, glass substrate, ceramic substrate, organic substrate). The substrate may include a set of through substrate vias (TSVs) and a set of pads. In some implementations, the substrate may also include other interconnects (e.g., traces). In some implementations, the set of pads is located on a first surface (e.g., top surface) of the substrate. In some implementations, the set of pads is embedded in the first surface of the substrate. In some implementations, the substrate may include a dielectric layer that is coupled (e.g., formed) on the first surface of the substrate.

The method further provides (at 1310) at least one die to the substrate. In some implementations, providing at least one die includes coupling a first die and a second die to the substrate. In some implementations, the first die is coupled to the substrate through a first set of interconnects (e.g., first pillar, first solder).

The method also provides (at 1315) an encapsulation layer. In some implementations, providing the encapsulation layer includes forming an encapsulation layer on the substrate and/or the dielectric layer on the substrate. In some implementations, the encapsulation layer encapsulates the first die. Different implementations may use different materials for the encapsulation layer. In some implementations, the encapsulation layer is a film layer. In some implementations, the encapsulation layer is made of a material that has a photo-patternable property.

The method then provides (at 1320) at least one via with a barrier layer in the encapsulation layer. In some implementations, providing at least one via with a barrier layer includes forming a cavity in the encapsulation layer and providing at least one metal layer in the cavity. In some implementations, the cavity is formed (e.g., created) over a pad. In some implementations, the cavity is formed by using a photo etching process (e.g., photolithography process).

In some implementations, providing at least one metal layer includes providing (e.g., forming) a barrier layer in the cavity. In some implementations, a plating process is used to form the barrier layer. The barrier layer may cover the inside walls of the cavity, at least part of the pad, and/or the first surface of the encapsulation layer. Different implementations may use different materials for the barrier layer. In some implementations, the barrier layer is one of at least titanium (Ti), (TiN), Aluminium Copper (AlCu), tinanium copper alloy (TiCu) and/or titanium tungsten copper alloy (TiWCu). However, different implementations may use different materials. As such, the material for the barrier layer should not be limited to the materials listed above.

In some implementations, providing at least one metal layer further includes providing (e.g., forming, depositing) a seed layer on the barrier layer. In some implementations, a plating process is used to form the seed layer on the barrier layer. Different implementations may use different materials for the seed layer.

In some implementations, providing a via with a barrier layer also includes providing (e.g., forming, depositing) a photo resist layer on the seed layer. In some implementations, providing the photo resist layer includes providing the photo resist layer 534 and selectively removing some portions of the photo resist layer.

The method then provides a metal layer on the seed layer. In some implementations, the metal layer is provided on the seed layer that is not covered by the photo resist layer. In some implementations, a lithography and plating process is used to provide the metal layer on the seed layer. In some implementations, the metal layer and the seed layer are the same material. Thus, in some implementations, the metal layer may include the seed layer.

The method may then selectively remove the photo resist layer, the seed layer, and the barrier layer are selectively removed (e.g., etched). In some implementations, the photo resist layer, the seed layer, and the barrier layer are removed concurrently. In some implementations, the photo resist layer, the seed layer, and the barrier layer are removed sequentially.

In some implementations, a dielectric layer may optionally be provided (e.g., formed) on a second surface of the encapsulation layer. In some implementations, another dielectric layer may optionally be provided (e.g., formed) on the second surface (e.g., bottom surface) of the substrate. In addition, a set of interconnects may also be provided on/in the dielectric layer.

Exemplary Electronic Devices

FIG. 14 illustrates various electronic devices that may be integrated with any of the aforementioned integrated device, semiconductor device, integrated circuit, die, interposer or package. For example, a mobile telephone 1402, a laptop computer 1404, and a fixed location terminal 1406 may include an integrated device 1400 as described herein. The integrated device 1400 may be, for example, any of the integrated circuits, dies, interposer, or packages described herein. The devices 1402, 1404, 1406 illustrated in FIG. 14 are merely exemplary. Other electronic devices may also feature the integrated device 1400 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5A-5C, 6, 7A-7C, 8, 9, 10A-10C, 11, 12A-12C, 13 and/or 14 may be rearranged and/or combined into a single component, step, feature or function or embodied in several components, steps, or functions. Additional elements, components, steps, and/or functions may also be added without departing from the disclosure. It should also be noted that FIGS. 3, 4, 5A-5C, 6, 7A-7C, 8, 9, 10A-10C, 11, 12A-12C, 13 and/or 14 and its corresponding description in the present disclosure is not limited to dies and/or ICs. In some implementations, FIGS. 3, 4, 5A-5C, 6, 7A-7C, 8, 9, 10A-10C, 11, 12A-12C, 13 and/or 14 and its corresponding description may be used to manufacture, create, provide, and/or produce integrated devices. In some an integrated device may include a die package, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
a first die;
an encapsulation layer comprising a photo-patternable property, wherein the encapsulation layer at least partially encapsulates the first die;
a via structure traversing the encapsulation layer, wherein the via structure comprises:
a via comprising a first side, a second side, and a third side; and
a barrier layer surrounding at least the first side and the third side of the via; and
a substrate coupled to the first die, the substrate comprising a pad coupled to the barrier layer of the via structure, wherein the pad is free of direct contact with the via of the via structure.

2. The integrated device of claim 1, further comprising a first dielectric layer coupled to a first surface of the encapsulation layer.

3. The integrated device of claim 2, further comprising a second dielectric layer coupled to a second surface of the encapsulation layer.

4. The integrated device of claim 1, wherein the via structure further comprises a fill, wherein the fill is an electrically non-conductive fill.

5. The integrated device of claim 1, wherein the via comprises a seed layer.

6. The integrated device of claim 1, wherein the via comprises a portion configured to operate as a pad.

7. The integrated device of claim 1, wherein the integrated device comprises an interposer, a package device, and/or a package-on-package (PoP) device.

8. The integrated device of claim 1, wherein the integrated device is incorporated into a music player, a video player, an entertainment unit, a navigation device, a communications device, a mobile device, a mobile phone, a smartphone, a personal digital assistant, a fixed location terminal, a tablet computer, and/or a laptop computer.

9. The integrated device of claim 1, wherein the via structure further comprises a polymer fill.

10. The integrated device of claim 1, wherein the barrier layer comprises titanium (Ti), titanium nitride (TiN), and/or titanium tungsten (TiW).

11. An apparatus comprising:
a first die;
an encapsulation layer comprising a photo-patternable property, wherein the encapsulation layer at least partially encapsulates the first die;
a via structure traversing the encapsulation layer, wherein the via structure comprises:
a via comprising a first side, a second side, and a third side; and
a barrier means surrounding at least the first side and the third side of the via; and
a substrate coupled to the first die, the substrate comprising a pad coupled to the barrier means of the via structure, wherein the pad is free of direct contact with the via of the via structure.

12. The apparatus of claim 11, further comprising a first dielectric layer coupled to a first surface of the encapsulation layer.

13. The apparatus of claim 12, further comprising a second dielectric layer coupled to a second surface of the encapsulation layer.

14. The apparatus of claim 11, wherein the via structure further comprises a fill means.

15. The apparatus of claim 11, wherein the via comprises a seed layer.

16. The apparatus of claim 11, wherein the via comprises a portion configured to operate as a pad.

17. The apparatus of claim 11, wherein the apparatus comprises an interposer, a package device, and/or a package-on-package (PoP) device.

18. The apparatus of claim 11, wherein the apparatus is incorporated into a music player, a video player, an entertainment unit, a navigation device, a communications device, a mobile device, a mobile phone, a smartphone, a personal digital assistant, a fixed location terminal, a tablet computer, and/or a laptop computer.

19. The apparatus of claim 11, wherein the barrier layer comprises titanium (Ti), titanium nitride (TiN), and/or titanium tungsten (TiW).

20. A method for fabricating an integrated device, comprising:
forming a pad on a substrate;
coupling a first die to the substrate;
forming an encapsulation layer over the substrate such that the encapsulation layer at least partially encapsulates the first die, wherein the encapsulation layer comprises a photo-patternable property; and
forming a via structure in the encapsulation layer, wherein forming the via structure comprises:
photo-etching a cavity in the encapsulation layer;
forming a barrier layer in the cavity of the encapsulation layer and over the pad of the substrate; and
forming a via on the barrier layer such that the via is free of direct contact with the pad, the via comprising a first side, a second side, and a third side, the via is formed on the barrier layer such that the barrier layer surrounds at least the first side and the third side of the via.

21. The method of claim 20, further comprising forming a first dielectric layer on a first surface of the encapsulation layer.

22. The method of claim 21, further comprising forming a second dielectric layer on a second surface of the encapsulation layer.

23. The method of claim 20, wherein forming the via structure further comprises forming a fill.

24. The method of claim 20, wherein forming the via comprises forming a seed layer on the barrier layer.

25. The method of claim 20, wherein forming the via comprises forming a portion a via as a pad.

26. The method of claim 20, wherein the integrated device comprises an interposer, a package device, and/or a package-on-package (PoP) device.

27. The method of claim 20, wherein the integrated device is incorporated into a music player, a video player, an entertainment unit, a navigation device, a communications device, a mobile device, a mobile phone, a smartphone, a personal digital assistant, a fixed location terminal, a tablet computer, and/or a laptop computer.

28. The method of claim 20, wherein forming the barrier layer comprises forming a titanium (Ti) layer, a titanium nitride (TiN) layer, and/or a titanium tungsten (TiW) layer in the encapsulation layer.

* * * * *